United States Patent
Ohashi et al.

(10) Patent No.: US 8,363,441 B2
(45) Date of Patent: Jan. 29, 2013

(54) POWER CONVERSION APPARATUS WITH M CONVERSION LEVELS HAVING AN INDIVIDUAL DRIVE UNIT THAT DOES NOT REQUIRE A DEDICATED POWER SUPPLY

(75) Inventors: Hiromichi Ohashi, Ibaraki (JP); Yukihiko Sato, Ibaraki (JP); Kyungmin Sung, Ibaraki (JP); Masamu Kamaga, Ibaraki (JP); Moe Imaizumi, Chiba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 733 days.

(21) Appl. No.: 12/320,355

(22) Filed: Jan. 23, 2009

(65) Prior Publication Data
US 2009/0195068 A1     Aug. 6, 2009

(30) Foreign Application Priority Data

Jan. 24, 2008   (JP) ................................ 2008-013911

(51) Int. Cl.
*H02M 7/5387*    (2007.01)
(52) U.S. Cl. ............................ 363/132; 363/71; 307/113
(58) Field of Classification Search ..................... 363/17, 363/40, 44, 125, 132, 65, 66, 67, 69, 71, 363/72; 307/18, 82, 112, 113
See application file for complete search history.

(56) References Cited

U.S. PATENT DOCUMENTS

| | | | | |
|---|---|---|---|---|
| 5,373,436 A | * | 12/1994 | Yamaguchi et al. | 363/98 |
| 5,943,229 A | * | 8/1999 | Sudhoff | 363/125 |
| 6,898,095 B2 | * | 5/2005 | Bijlenga et al. | 363/132 |
| 7,554,824 B2 | * | 6/2009 | Stefanutti et al. | 363/69 |
| 8,289,742 B2 | * | 10/2012 | Adest et al. | 363/71 |
| 2009/0296433 A1 | * | 12/2009 | Sihler et al. | 363/65 |

FOREIGN PATENT DOCUMENTS

JP         2007-325480         12/2007

OTHER PUBLICATIONS

Y. Hayashi et al., "Design Consideration for High Output Power Density (OPD) Converter Based on Power-loss Limit Analysis Method", in Proc. CD-ROM, EPE, pp. 1-9, 2005.
M. Tsukuda et al., "Demonstration of High Output Power Density (30 W/cc) Converter using 600V SiC-SBD and Low Impedance Gate Driver" in Proc. CD-ROM, IPEC Niigata, pp. 1184-1189, 2005.

* cited by examiner

*Primary Examiner* — Jessica Han
*Assistant Examiner* — Lakaisha Jackson
(74) *Attorney, Agent, or Firm* — Wenderoth, Lind & Ponack, L.L.P.

(57) ABSTRACT

To realize power supply to each gate drive circuit without using an individual dedicated power supply for each gate drive circuit. A power conversion apparatus includes an individual drive unit that does not require a dedicated power supply, and includes gate drivers connected to switches and interface circuits and a power converter gate drive configured with a common power supply for supplying power to the gate drive unit. Power is supplied from main circuits or a number of common power supplies fewer than that of the number of the switches through one or more power supply terminals included in the interface circuit. Also, the signal can be transmitted by isolation from a signal source to the gate drivers.

8 Claims, 43 Drawing Sheets

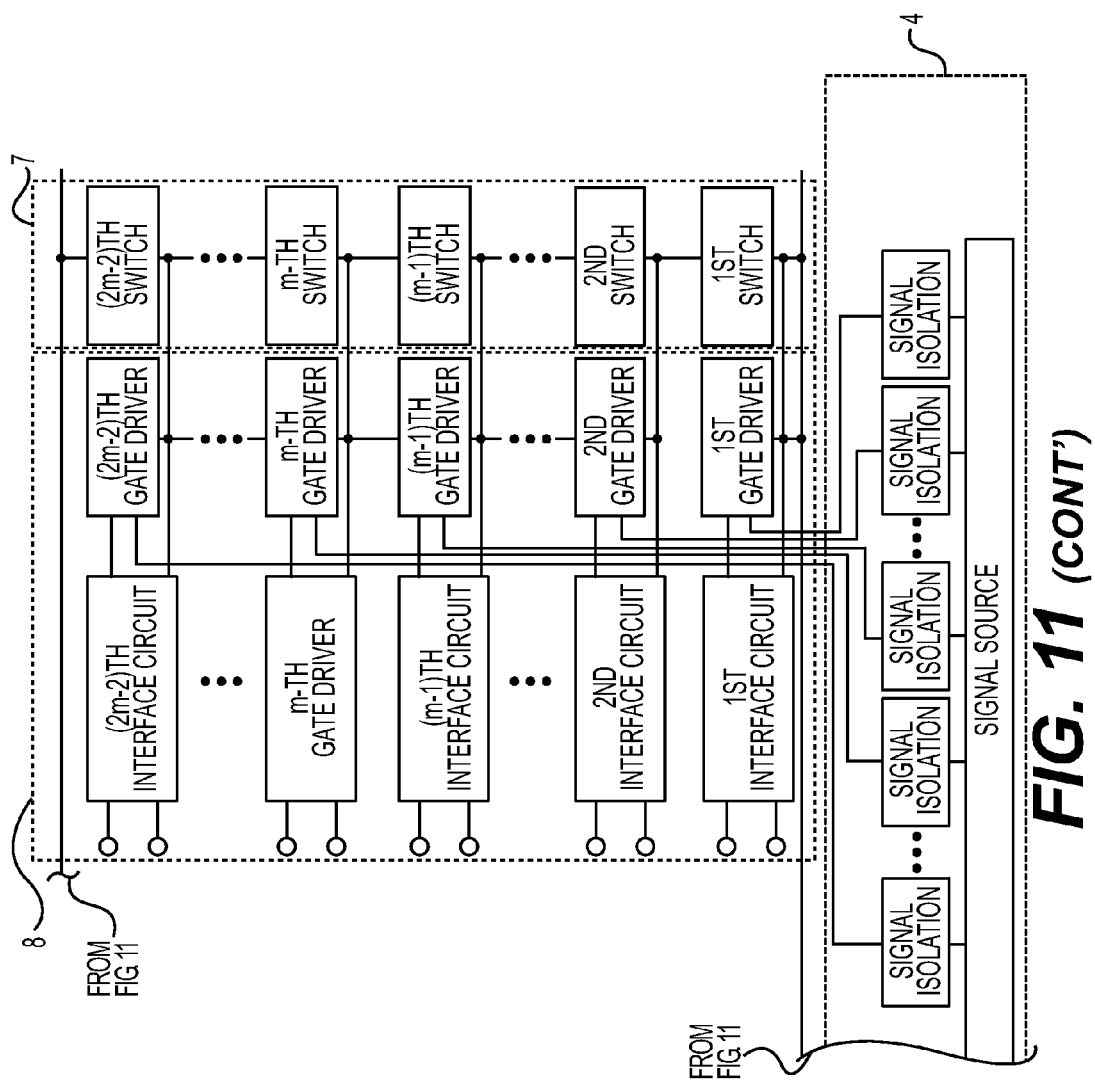
FIG. 11 (CONT')

POWER CONVERSION APPARATUS WITH M CONVERSION LEVELS HAVING AN INDIVIDUAL DRIVE UNIT THAT DOES NOT REQUIRE A DEDICATED POWER SUPPLY

BACKGROUND OF THE INVENTION

1. Field of the Invention

The present invention relates to a power conversion apparatus, and in particular to a power conversion apparatus for realizing a high output power density converter configured with a plurality of switches or a power integrated circuit.

2. Description of the Related Art

FIGS. 2 to 5 are diagrams showing the configuration of a conventional two-level power conversion circuit. FIG. 2 shows a three-phase inverter, FIG. 3 a single-phase inverter, FIG. 4 a DC-DC converter, and FIG. 5 a three-phase/three-phase power converter. In each case, the DC power source voltage Vdc is switched in two levels by turning on/off six, four, or two semiconductor elements, and further, by connecting a passive filter to the output thereof, a three-phase or single-phase AC output or DC output is obtained. A power converter conventionally achieves a high output power density with this two-level power conversion circuit by reducing the volume according to a method (1) in which the loss of the power conversion apparatus is reduced, thereby reducing the volume of the cooling unit, or (2) in which the switching frequency is increased, thereby reducing the volume of the passive parts such as the passive filter configured with an inductor or capacitor (see Y. Hayashi, K. Takao, K. Adachi, and H. Ohashi, "Design Consideration for High Output Power Density (OPD) Converter Based on Power-Loss Limit Analysis Method", in *Proc. CD-ROM*, EPE, 2005, and M. Tsukuda, T. Omura, W. Saito, and T. Ogura, "Demonstration of High Output Power Density (30 W/cc) Converter using 600 V SiC-SBD and Low Impedance Gate Driver", in *Proc. CD-ROM*, IPEC Niigata, 2005.). However, because the two-level power conversion circuit always contains a high harmonic, the passive filter is indispensable. Also, the increased switching frequency increases the switching loss at the time of the switching operation of the semiconductor elements, resulting in a bulky cooling unit; therefore, the increase in output power density is limited.

In cases where the power conversion apparatus is driven with a high switching frequency, the induction voltage due to the parasitic inductance of a main circuit wiring and the displacement current due to the parasitic capacitance cause electromagnetic noise and an increased loss of the semiconductor element. Electromagnetic noise gives rise to various problems such as the malfunction of the gate drive circuit, the deteriorated insulation of a motor connected to the power converter or the electric erosion of a bearing. Thus, a power conversion circuit of high output power density is required from which the passive filter is eliminated and which reduces the loss of the semiconductor element at the same time without increasing the switching frequency.

In cases where the power conversion apparatus is driven with a high switching frequency, the common mode voltage of the power conversion circuit vibrates, causing peripheral devices to be adversely affected. For this reason, a noise suppression filter such as a common mode choke coil or EMI filter is required.

In order to remove the passive filter without increasing the switching frequency, a method is available in which, as shown in FIGS. 6 to 8, the number m of the levels of the multilevel power converter is increased, therefore decreasing the harmonic content of the output voltage of the power converter (Japanese Patent Application Laid-Open No. 2007-325480). The high harmonic component of the output voltage of the multilevel power converter decreases with the increase in the number of levels. For example, the total distortion rate of the output phase voltage is 5% or lower for 17 levels, 3% or lower for 25 levels, and 2% or lower for 35 levels. This shows that the passive filter becomes unnecessary as the number m of levels increases. The number of semiconductor elements is 32 and the number of inverse parallel diodes is 32 per phase for the 17-level power converter; the number of semiconductor elements is 48 and the number of inverse parallel diodes is 48 per phase for the 25-level power converter; and the number of semiconductor elements is 68 and the number of inverse parallel diodes is 68 per phase for the 35-level power converter. As a result, the gate drive circuit connected to the main circuit switch and the main circuit of the power converter increases in size to such an extent that it becomes difficult to implement the power converter.

FIGS. 6 to 8 show representative systems of the multilevel power conversion circuit. FIG. 6 shows a three-phase inverter of a diode-clamp multilevel power converter, FIG. 7 a three-phase inverter of a flying-capacitor multilevel power converter, and FIG. 8 a three-phase inverter of a cascade-connected multilevel power converter. The three-phase inverter shown in each case may be a three-phase AC-DC power converter, a single-phase inverter, a single-phase AC-DC converter, a DC-DC converter, or an AC-AC converter.

The multilevel power conversion circuits shown in FIGS. 6 to 8 require a gate drive circuit for each switching semiconductor element; therefore, the number of gate drive circuits increases as the number of levels increases. In the m-level power conversion circuit shown in FIGS. 6 to 8, for example, (2m−2) gate drive circuits are required for each phase.

FIG. 9 is a diagram showing the configuration of one phase of the conventional multilevel power conversion circuit that includes switches connected in a series, and gate drivers and dedicated power supplies connected to the respective switches. The potential on the low potential side of each switch connected in the series differs from one switch to another; therefore, each dedicated power supply requires insulation. As a result, a transformer or similar device is used as the dedicated power supply, thereby making integration difficult.

A one-chip power IC and an intelligent power module (IPM) using LSI technology have been developed and have found applications in various fields. Although an integrated two-level power converter with a gate drive circuit using this technology has been proposed, a power integrated circuit that includes an insulated power supply with increased number of gate drive circuits in the multilevel power converter has never been proposed.

In the high output power density conversion apparatus using the two-level power converter described above, the filter is reduced in size by increasing the switching frequency; therefore, the switching loss is increased at the time of the switching operation of the semiconductor element, thereby limiting the higher output power density of the power conversion apparatus.

In cases where the power conversion apparatus is driven by a high switching frequency, a great amount of electromagnetic noise is generated by the induced voltage due to the parasitic induction of the main circuit wiring, the displacement current due to the parasitic capacitance and the vibration of a common mode voltage of a power conversion circuit. As a result, a noise suppression filter such as a common mode choke coil or EMI filter is required, which in turn limits the higher output power density of the power conversion apparatus.

The great amount of electromagnetic noise generated from the power conversion apparatus driven by a high switching frequency makes it impossible to realize a high-speed rotation of a motor connected to the power conversion apparatus, and thereby limits a higher output power density of the motor.

There has been a proposal for realization of a high output power density converter by a very different method from that described above: reducing the size of the passive filter without increasing the switching frequency (Japanese Patent Application Laid-Open No. 2007-325480). Nevertheless, there has been no proposal for a high output power density converter or a power integrated circuit for a multilevel power conversion circuit that includes an insulated power supply of a gate drive circuit.

Because a dedicated power supply configured with a transformer or similar device is required for the insulated power supply of the gate drive circuit, a power conversion apparatus with a number of switches that have an output power capacity of several dozen of kVA or less has not been realized.

Because a dedicated power supply configured with a transformer or similar device for the insulated power supply of the gate drive circuit is required, a power conversion apparatus with a phase voltage distortion rate of 10% or less without a passive filter for several dozen of kVA or less in the output power capacity has not been realized.

Also, because a dedicated power supply configured with a transformer or similar device is required for the insulated power supply of the gate drive circuit, a power conversion apparatus in which the electromagnetic noise has no influence on the peripheral devices without a noise suppression filter for an output power capacity of several dozen kVA or less has not been realized.

SUMMARY OF THE INVENTION

An object of the present invention is to solve these problems and enable a power supply for each gate drive circuit without using an individual dedicated power supply for each gate drive circuit.

In order to solve these problems and achieve the object described above, the present invention provides a power conversion apparatus or a power integrated circuit comprising an individual gate drive unit that includes gate drivers and interface circuits connected to a plurality of switches, respectively, without using a dedicated power supply or a power converter gate drive configured with a common power supply for supplying power to the gate driver unit, wherein power can be supplied from the common power supplies or a number of main circuits smaller than the number of switches through one or a plurality of power supply terminals provided in the interface circuits, and the power converter gate drive circuit enables signal transmission by isolation of a signal to the gate drivers from a signal source.

The present invention is intended to realize a power conversion apparatus or a power integrated circuit with the aforementioned multilevel power converter and thereby provide a high output power density conversion apparatus, which cannot be realized with a conventional two-level power conversion apparatus, without using a passive filter, while reducing the size of the cooling unit by reduced loss.

The present invention is intended to realize a power conversion apparatus or a power integrated circuit with the aforementioned multilevel power converter and thereby provide a power conversion apparatus with a phase voltage distortion rate of 10% or less without the passive filter.

The present invention is intended to realize a power conversion apparatus or a power integrated circuit with the aforementioned multilevel power converter and thereby provide a power conversion apparatus with a very small electromagnetic noise requiring no noise suppression filter.

The present invention is intended to realize a power conversion apparatus or a power integrated circuit with the aforementioned multilevel power converter and thereby provide a power conversion apparatus that is free of electromagnetic noises otherwise caused by induced voltage due to the parasitic inductance of a main circuit wiring and displacement current due to the parasitic capacitance, and which poses no malfunctioning of the gate drive circuit, deteriorated insulation of a motor connected to the power conversion apparatus, or electronic erosion of a bearing.

The present invention is intended to realize a power conversion apparatus or a power integrated circuit with the aforementioned multilevel power converter and thereby provide a power conversion apparatus with a high-speed and high output power density of the motor connected to the power conversion apparatus.

DESCRIPTION OF THE PREFERRED EMBODIMENT

An example of a multilevel power converter using a plurality of switches is explained below. The present invention, however, is not limited to this configuration, but is also applicable as a power conversion apparatus for DC-AC, AC-DC, DC-DC, or AC-AC conversion, as a multiplex or multi-parallel power conversion apparatus, or as any combination of these power conversion apparatuses.

(Monophase Multilevel Power Conversion Circuit)

Figure 1:
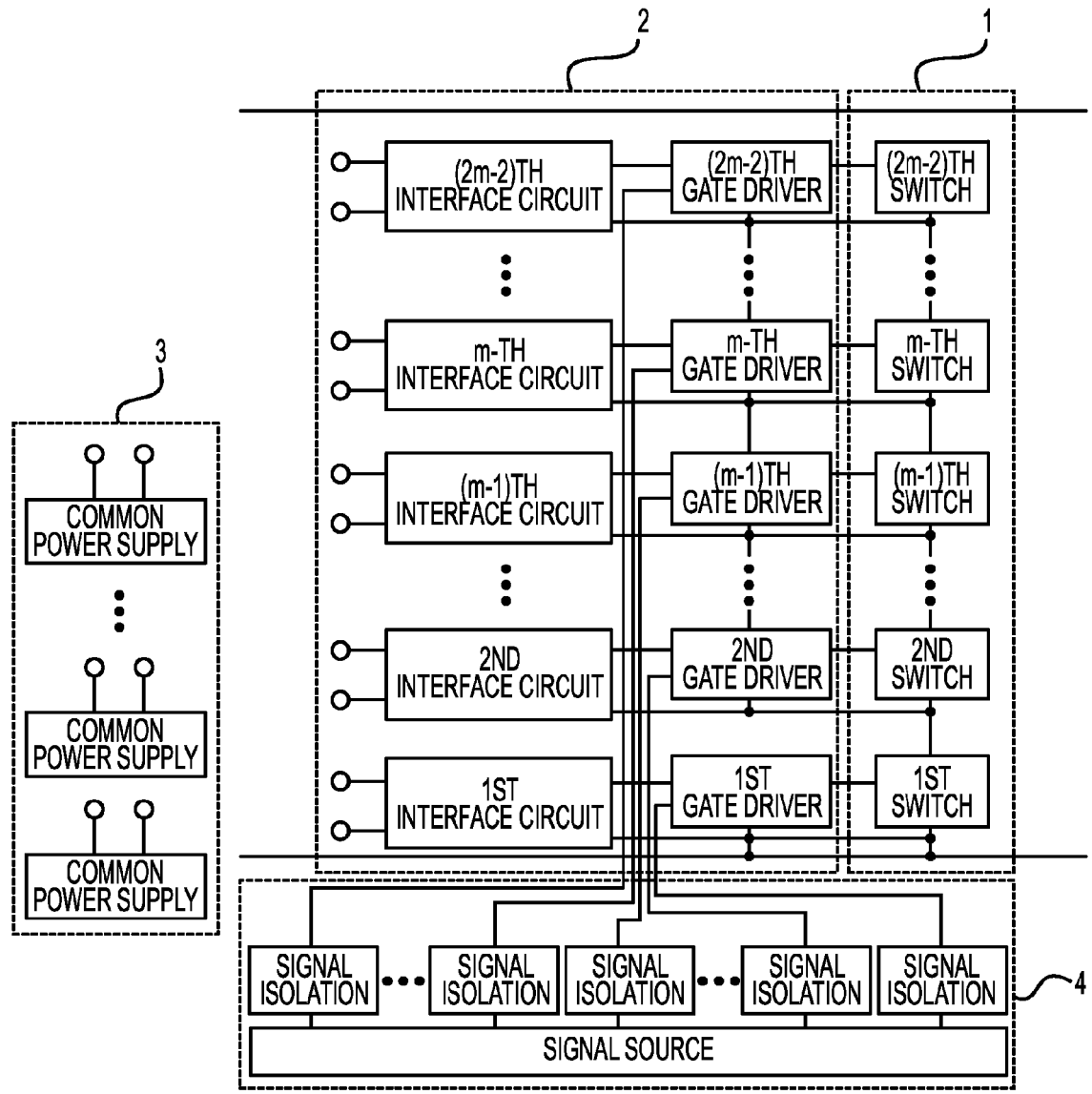
FIG. 1 shows a power conversion apparatus that includes a plurality of switches, a gate drive unit with multiple interface circuits with no dedicated power supply, and gate drivers, common power supplies, and a signal source.
Figure 2:
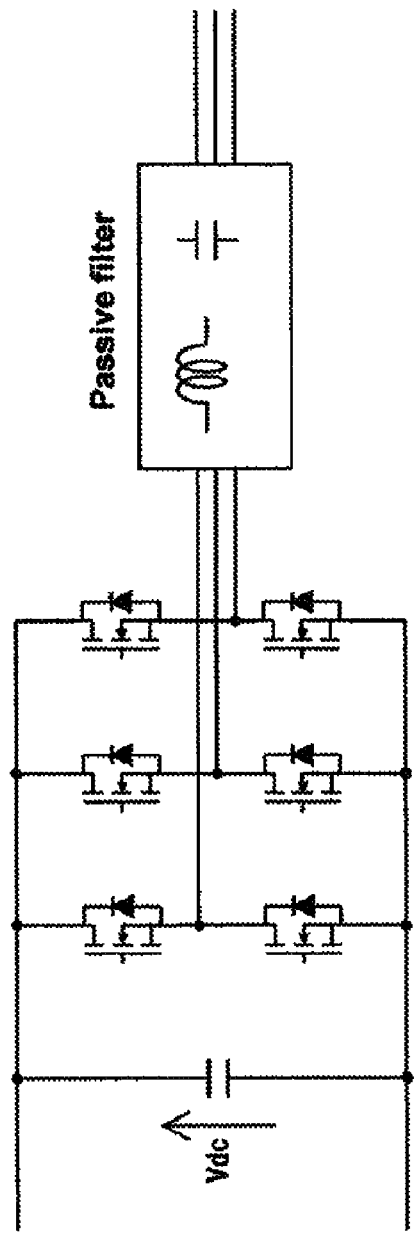
FIG. 2 is a diagram showing the configuration of a conventional two-level two-phase inverter.
Figure 3:
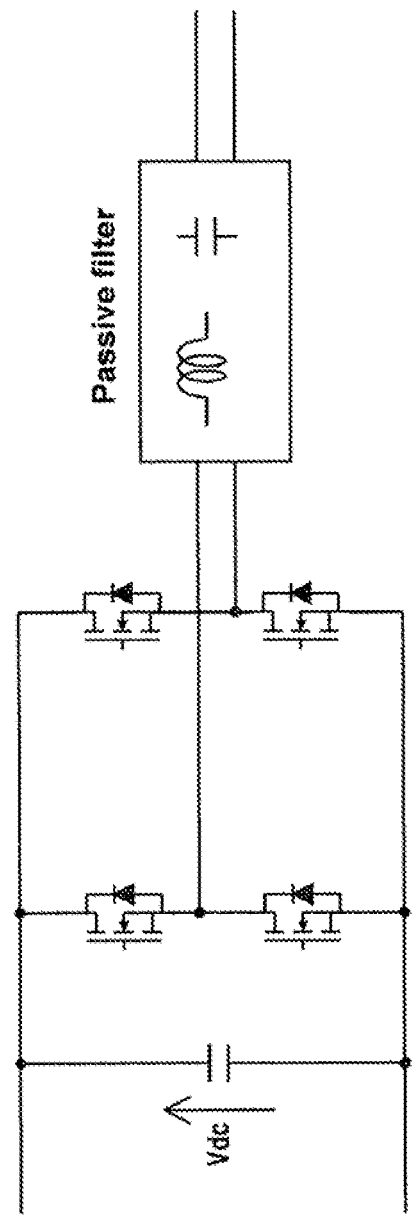
FIG. 3 is a diagram showing the configuration of a conventional two-level single-phase inverter.
Figure 4:
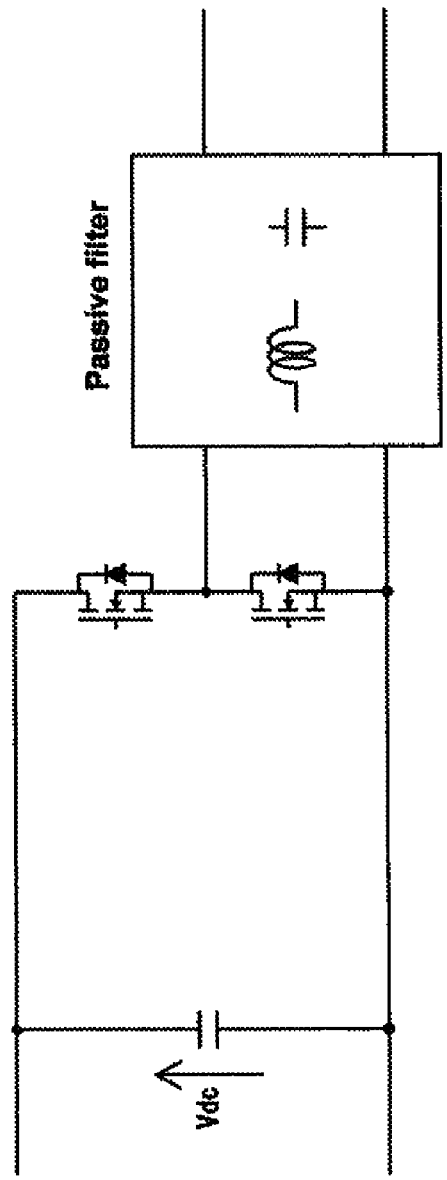
FIG. 4 is a diagram showing the configuration of a conventional two-level DC-DC converter.
Figure 5:
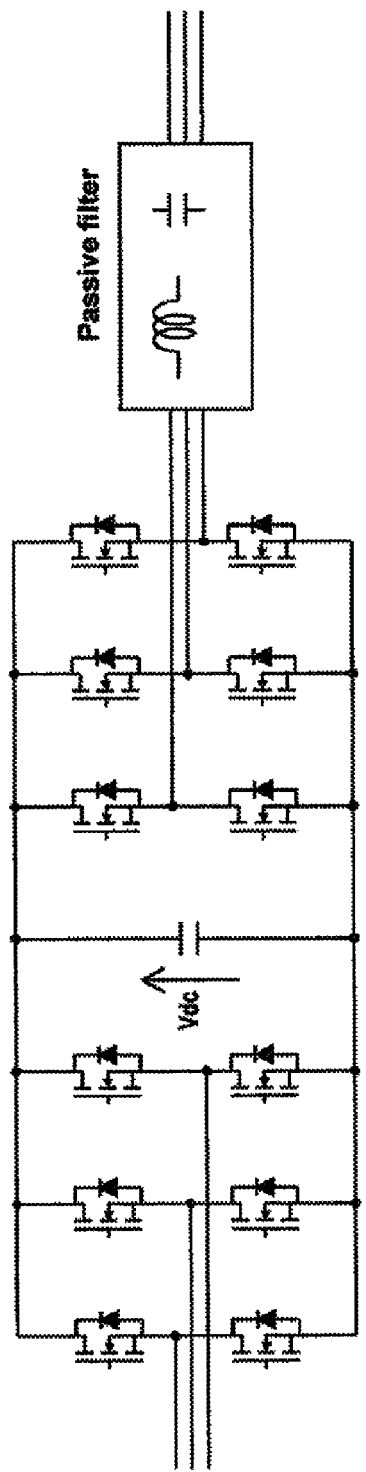
FIG. 5 is a diagram showing the configuration of a conventional two-level three-phase/two-phase power converter.
Figure 6:
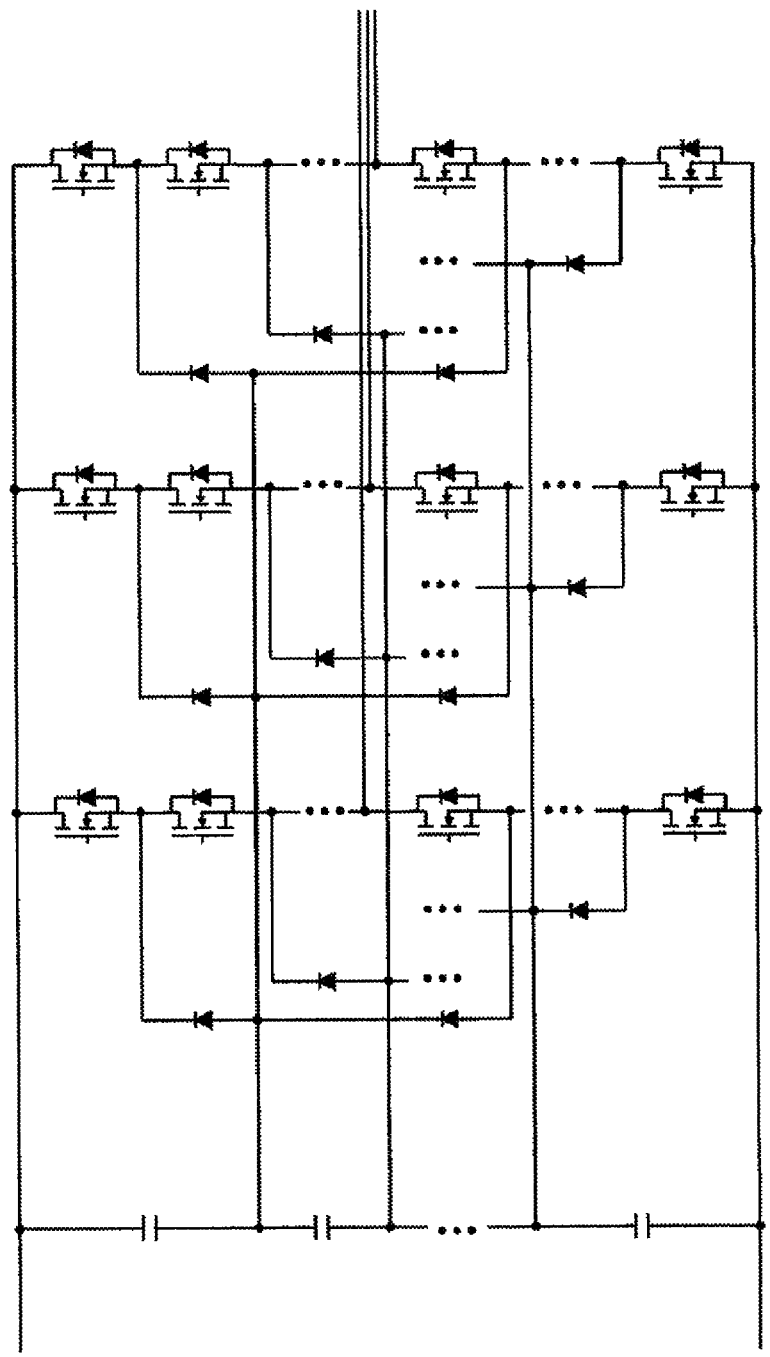
FIG. 6 is a diagram showing the configuration of a three-phase inverter of a diode-clamp multilevel power conversion circuit.
Figure 7:
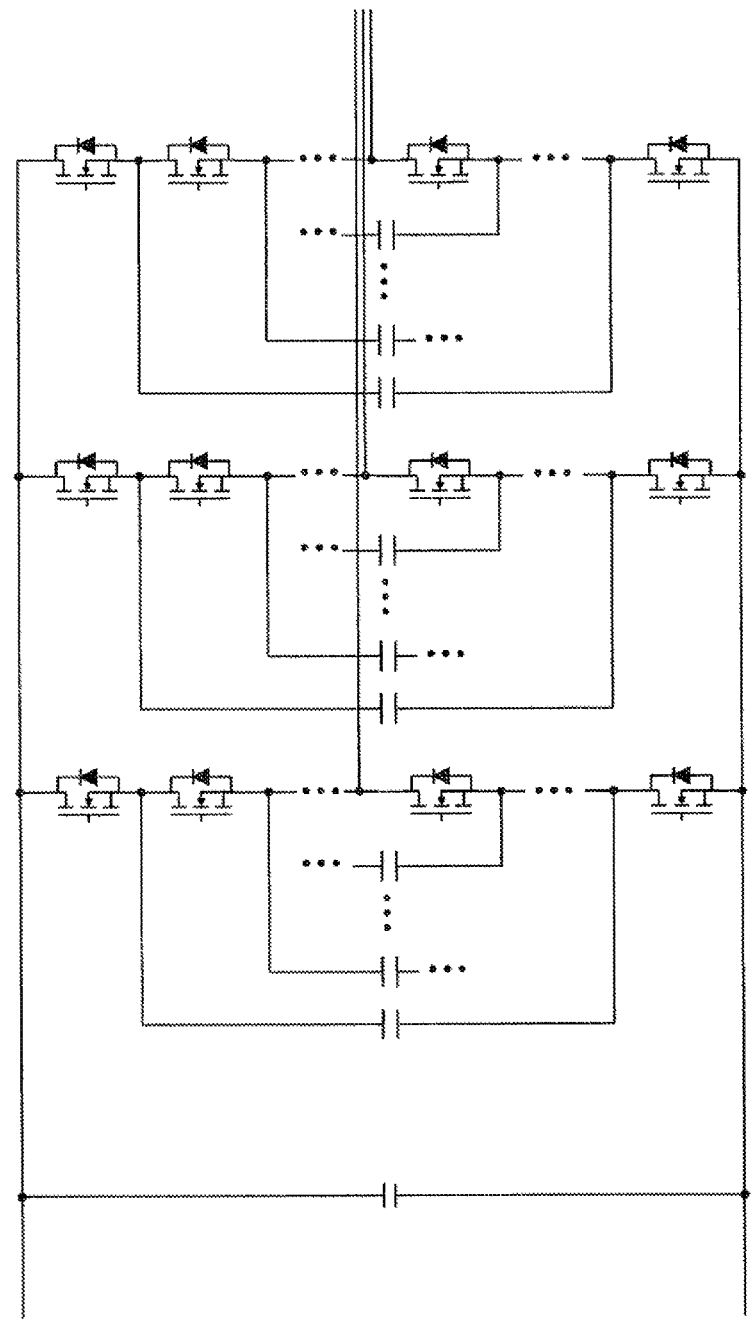
FIG. 7 is a diagram showing the configuration of a three-phase inverter of a flying-capacitor multilevel power conversion circuit.
Figure 8:
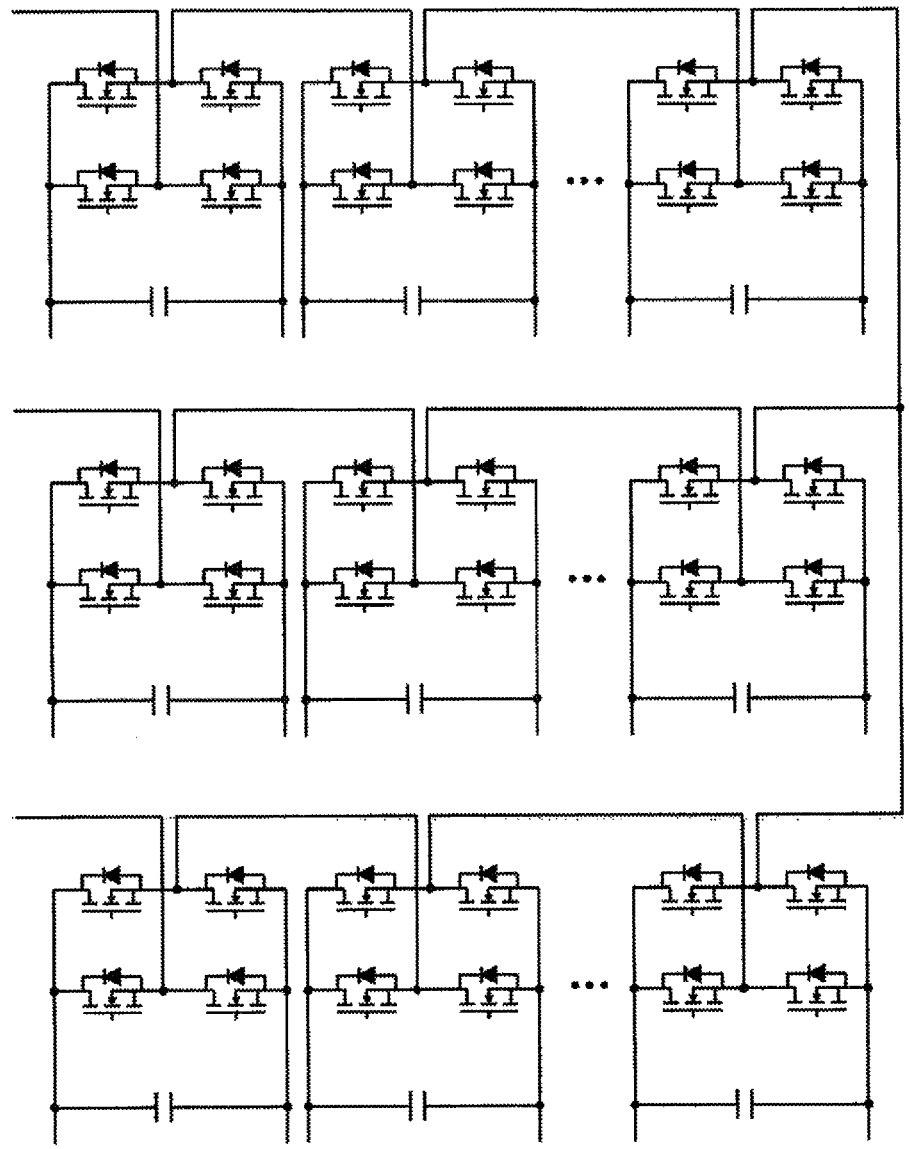
FIG. 8 is a diagram showing the configuration of a three-phase inverter of a cascade-connected multilevel power conversion circuit.
Figure 9:
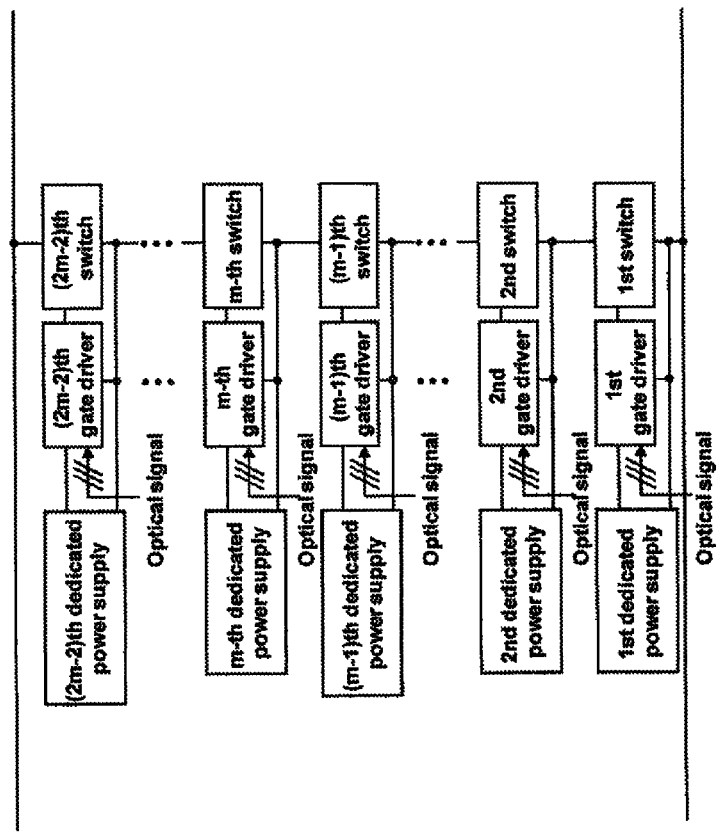
FIG. 9 is a diagram showing the configuration of a conventional example of the gate drive circuit of a conventional multilevel power conversion circuit.

An embodiment of the invention is explained in detail below with reference to the drawings. FIG. 1 shows one phase of a multilevel power conversion circuit with m conversion levels configured with series connection 1 of first to (2m−2)th switches (main switches). This power conversion circuit has an individual drive unit 2 that does not require a dedicated power supply and is configured with gate drivers and interface circuits each connected to the corresponding one of a plurality of switches, common power supplies 3 for supplying power to the gate drive unit 2, and a signal output unit 4 for isolating each signal from the signal source and transmitting the signal to the gate drivers connected to the switches, respectively.

FIG. 1 shows one phase of the multilevel power conversion circuit with m conversion levels configured with the series connection 1 of the first to (2m−2)th switches. Two of these monophase circuits are arranged in parallel to realize a single-phase multilevel power conversion circuit. Additionally, three of these monophase circuits are arranged in parallel to realize a three-phase multilevel power conversion circuit. Further, six of these monophase circuits are arranged in parallel to realize a three-phase AC/three-phase AC multilevel power conversion circuit.

As shown in FIG. 1, each interface circuit has a power supply terminal. By connecting the power supply terminal to other power supply terminals and the common power supplies, each interface circuit supplies power to the gate driver unit as described in detail below. Also, power is supplied to the gate driver unit by connecting these power supply terminals to a main circuit configured with the series-connection 1 of the first to (2m−2)th switches. Further, power is supplied to the gate driver unit by connecting these power supply terminals to other power supply terminals, the common power supplies, and the main circuit. Power is supplied to the gate driver unit through the interface circuits by using no common power supply or one or less than (2m−2) common power supplies. The main circuit is configured with the series connection 1 of the first to (2m−2)th switches, and handles the power between input and output of the power conversion apparatus.

The interface circuit has one or a plurality of power supply terminals connected, and supplies power to the gate driver unit from the common power supplies 3 or the series connection 1 of the first to (2m−2)th switches. Power is supplied to the gate driver unit by using the interface circuits, which are described in detail below (FIGS. 12 to 36), with a bootstrap circuit usable also in two levels. Power is also supplied to the gate driver unit by using interface circuits with a charge pump circuit usable also in two levels. Power is further supplied to the gate driver unit by using interface circuits with both the bootstrap circuit and the charge pump circuit usable in two levels. Power is also supplied to the gate driver unit by using interface circuits with a self-feeding system for supplying power from the main circuit usable also in two levels. Power is further supplied to the gate driver unit by using interface circuits with the self-feeding system and the bootstrap circuit for supplying power from the main circuit usable also in two levels. Power is also supplied to the gate driver unit by using interface circuits with the self-feeding system and the charge pump circuit for supplying power from the main circuit usable also in two levels. Furthermore, power is supplied to the gate driver unit by using interface circuits with the self-feeding system, the bootstrap circuit and the charge pump circuit for supplying power from the main circuit usable also in two levels.

As shown in FIG. 1, the power conversion apparatus according to the invention has a signal source. The signal source is connected to the gate driver connected to each switch and signal isolation is secured therebetween, thereby transmitting the signal to each gate driver. This signal isolation can be realized by a level shift circuit, magnetic coupling or optical insulation (for detail, refer to FIGS. 37 to 42).

The power conversion apparatus shown in FIG. 1 is integrated in its entirety as a single chip. Alternatively, this power conversion apparatus is integrated in a plurality of chips and implemented on a substrate. Alternatively, a part of the power conversion apparatus is integrated, and the integrated and individual parts are combined and installed on the substrate. This integration is realized by one material or a combination of a plurality of materials that includes silicon, gallium nitride, silicon carbide, and diamond.

(Single-Phase Multilevel Power Converter)

Figure 10:
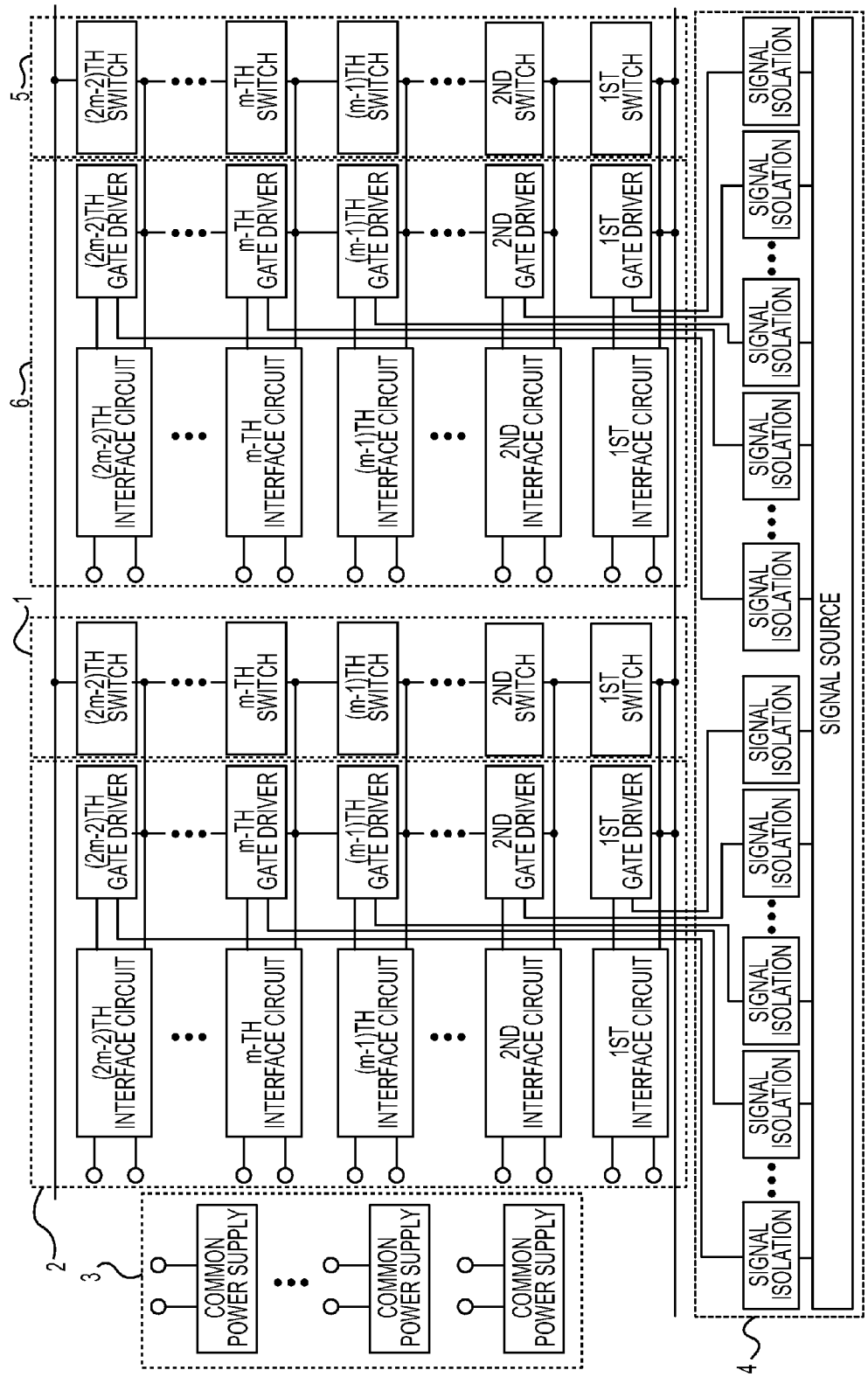
FIG. 10 is a diagram showing the configuration of a two-phase power supply interface circuit.

FIG. 10 shows a single-phase multilevel power converter in which the plurality of series switches and a phase of the gate drive unit shown in FIG. 1 are arranged in two parallels. FIG. 10 shows a power conversion apparatus that includes series connections 1 and 5 of the first to (2m−2)th switches, individual gate drive units 2 and 6 requiring no dedicated power supply and configured with interface circuits and gate drivers connected to each of a plurality of switches, common power supplies 3 for supplying power to the gate driver units, and a signal output unit 4 for securing isolation from the signal source for each signal and transmitting the signal to the gate drivers connected to the switches. The gate driver units 2 and 6 are required for each phase, while the common power supplies 3 can be shared by the gate driver units 2 and 6. Therefore, the series switches can be arranged in two parallels, forming a single-phase multilevel power converter without increasing the number of the common power supplies.

(Three-Phase Multilevel Power Converter)

Figure 11:
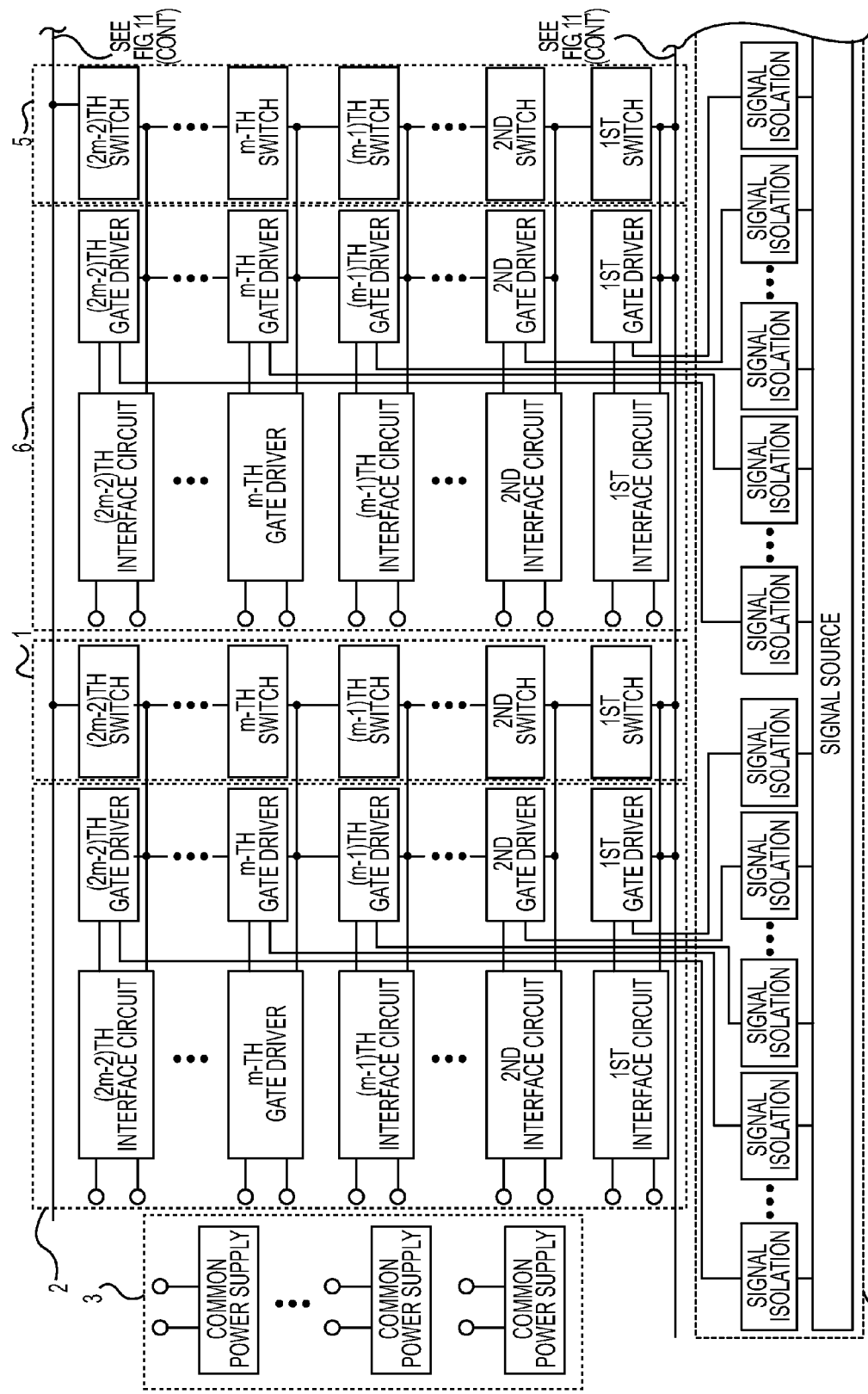
FIG. 11 is a diagram showing the configuration of a three-phase power supply interface circuit.

FIG. 11 shows a three-phase multilevel power converter that includes one phase of the plurality of series switches and the gate driver unit shown in FIG. 1 arranged in three parallels. FIG. 11 shows a power conversion apparatus that includes series connections 1, 5, and 7 of the first to (2m−2)th switches, individual gate driver units 2, 6 and 8, requiring no dedicated power supply, each configured with interface circuits and gate drivers connected to each of a plurality of switches, common power supplies 3 for supplying power to the gate drive units and a signal output unit 4 for securing isolation of each signal from the signal source and transmitting the signal to the gate drivers connected to each switch. Although the gate driver unit is required for each phase, the common power supplies 3 can be shared by the gate driver units 2, 6 and 8; therefore, the number of common power supplies does not need to be increased even for the three-phase multilevel power converter with series switches arranged in three parallels.

(Example 1 of Power Supply to Gate Drivers)

Figure 12:
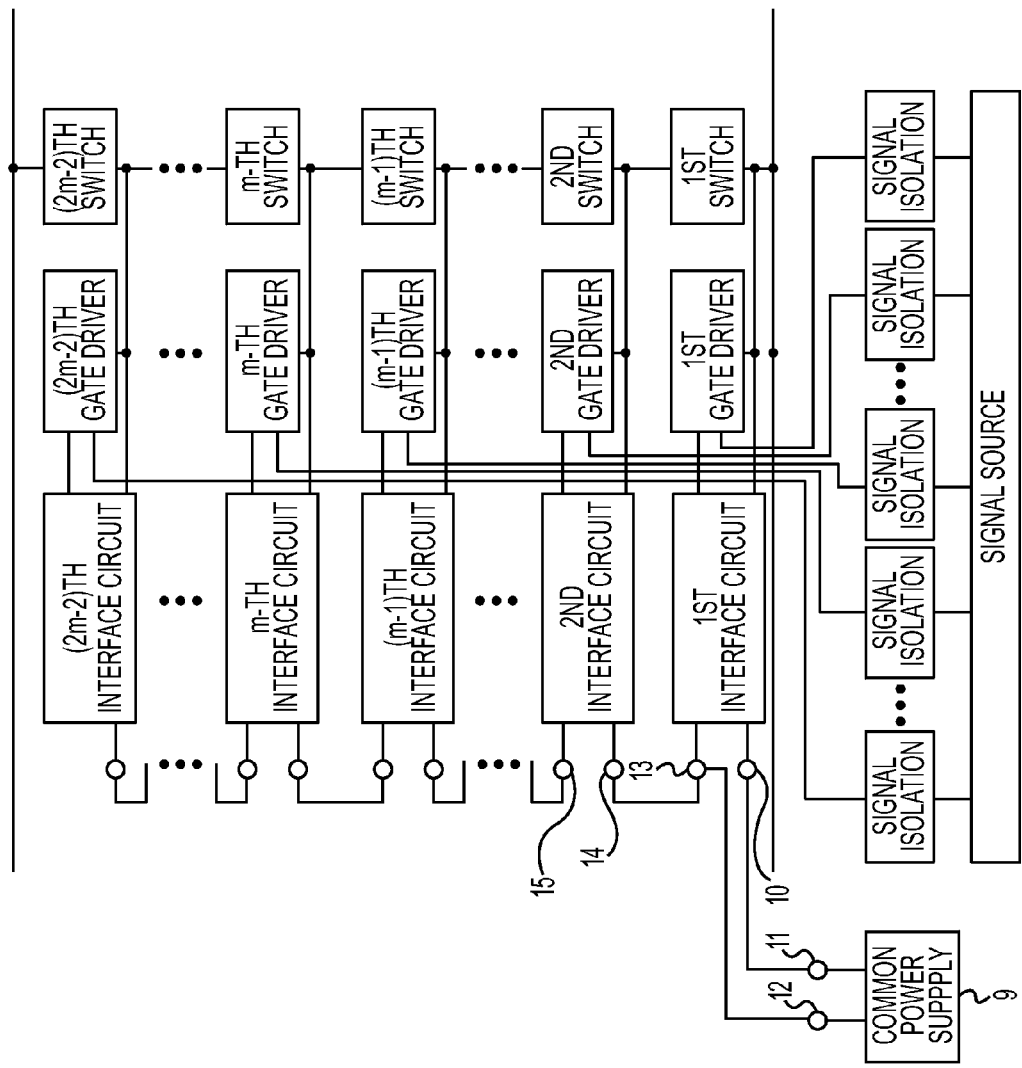
FIG. 12 is a diagram showing the configuration that includes a single common power supply and interface circuits connected in a series.

FIG. 12 shows a gate drive circuit for the multilevel power converter for supplying power to the gate drivers by connecting the interface circuit of FIG. 1 to one common power supply 9 and other interface circuits. A power supply terminal 10 of the first interface circuit is connected with a ground side terminal 11 of the common power supply 9, while a high voltage side terminal 12 of the common power supply, a power supply terminal 13 of the first interface circuit, and a power supply terminal 14 of the second interface circuit are connected to each other. Further, a power supply terminal 15 of the second interface circuit is connected with the upper power supply terminals so that power can be supplied to all gate drivers through the interface circuits from the single common power supply 9.

Figure 13:
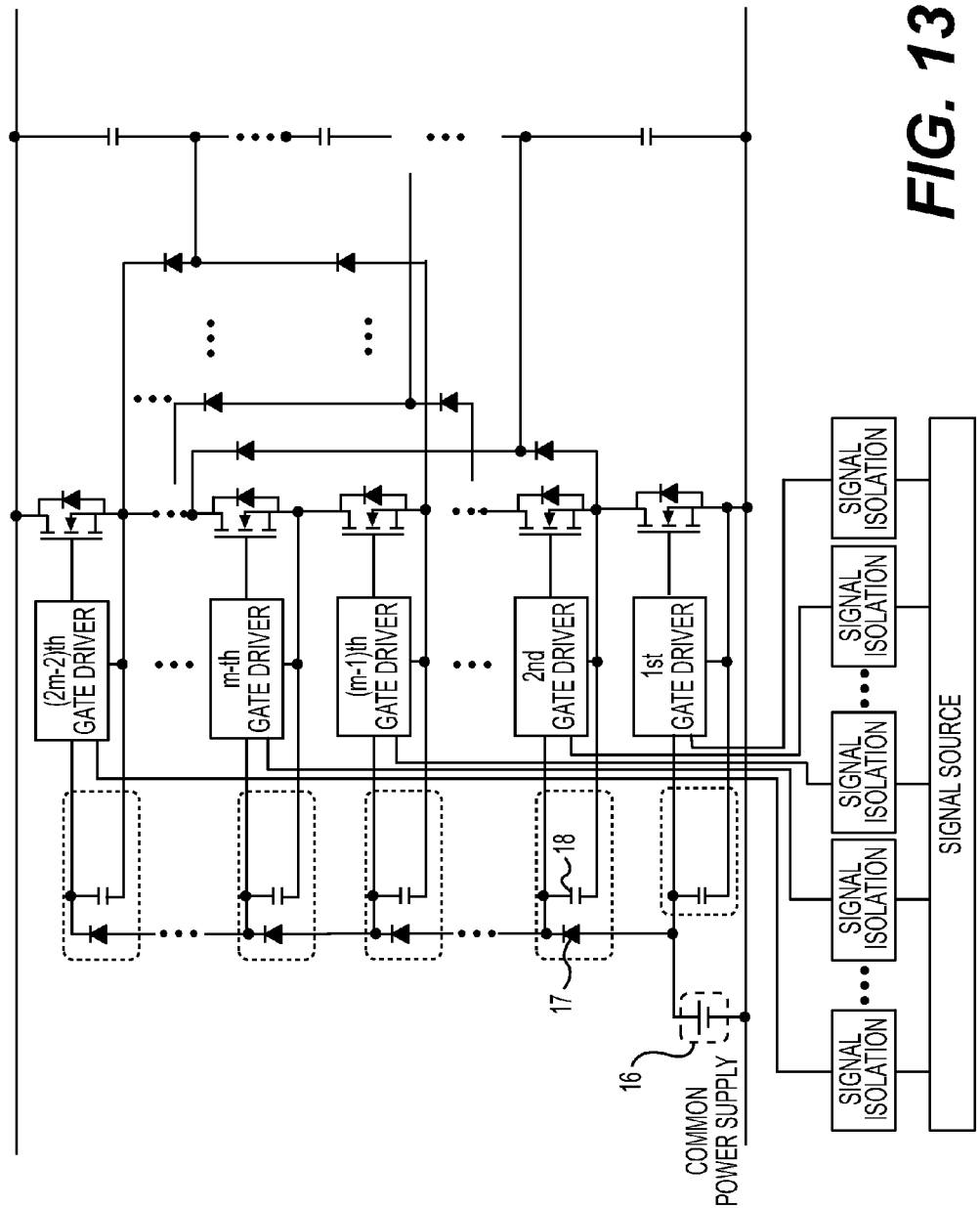
FIG. 13 shows a power conversion apparatus for supplying a gate power by series connection of a bootstrap circuit to the diode-clamp multilevel power conversion circuit.

FIG. 13 shows a diode-clamp multilevel power conversion circuit in which the interface circuit shown in FIG. 12 is realized with a bootstrap circuit configured with a diode and capacitor. The diode-clamp multilevel power conversion circuit has a plurality of internal voltage sources due to the rectification operation of the diode. Also, the bootstrap circuit charges the high-voltage side capacitor from the power supply or capacitor on low voltage side by a combination of a diode and a capacitor. The capacitor 18 is charged by a single common power supply 16 through the diode 17 and supplies power to the second gate driver. Similarly, the upper capacitor is charged by the lower capacitor and the common power supply 16 through diodes arranged in a series. As a result, the variation in the low-voltage side potential of the main switches due to the switching of the main circuit makes it possible to charge the capacitor in the upper interface circuit from the low voltage side. Thus, the active element in the interface circuit is unnecessary, and power can be supplied from the single common power supply 16 to all of the gate drivers.

Figure 14:
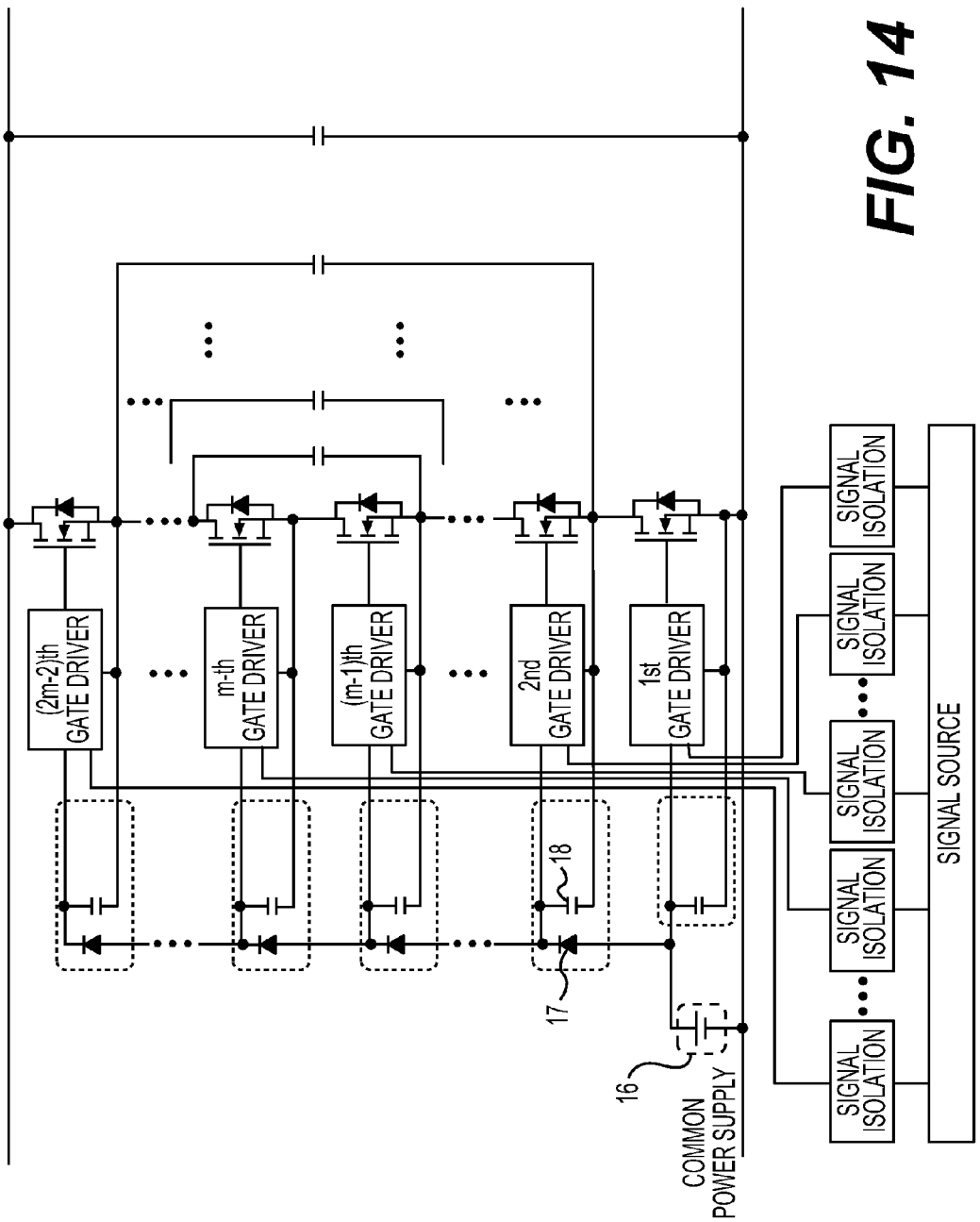
FIG. 14 shows a power conversion apparatus for supplying the gate power by series connection of a bootstrap circuit to a flying-capacitor multilevel power conversion circuit.

FIG. 14 shows a flying-capacitor multilevel power conversion circuit that includes the interface circuit of FIG. 12 as the bootstrap circuit configured with a diode and a capacitor. The flying-capacitor multilevel power conversion circuit includes multiple source voltages in the conversion circuit because it includes a plurality of capacitors. The capacitor 18 is charged by the single common power supply 16 through the diode 17 in order to supply power to the second gate driver. Similarly, the upper capacitor is charged from the lower capacitor and the common power supply 16 through the diodes arranged in a series. As a result, the variation in the low-voltage side potential of each main switch due to switching of the main circuit can charge the capacitors in the upper interface circuits from the low-voltage side. Accordingly, the active elements in the interface circuit are unnecessary, and power can be supplied to all of the gate drivers from the single common power supply 16.

(Example 2 of Power Supply to Gate Drivers)

Figure 15:
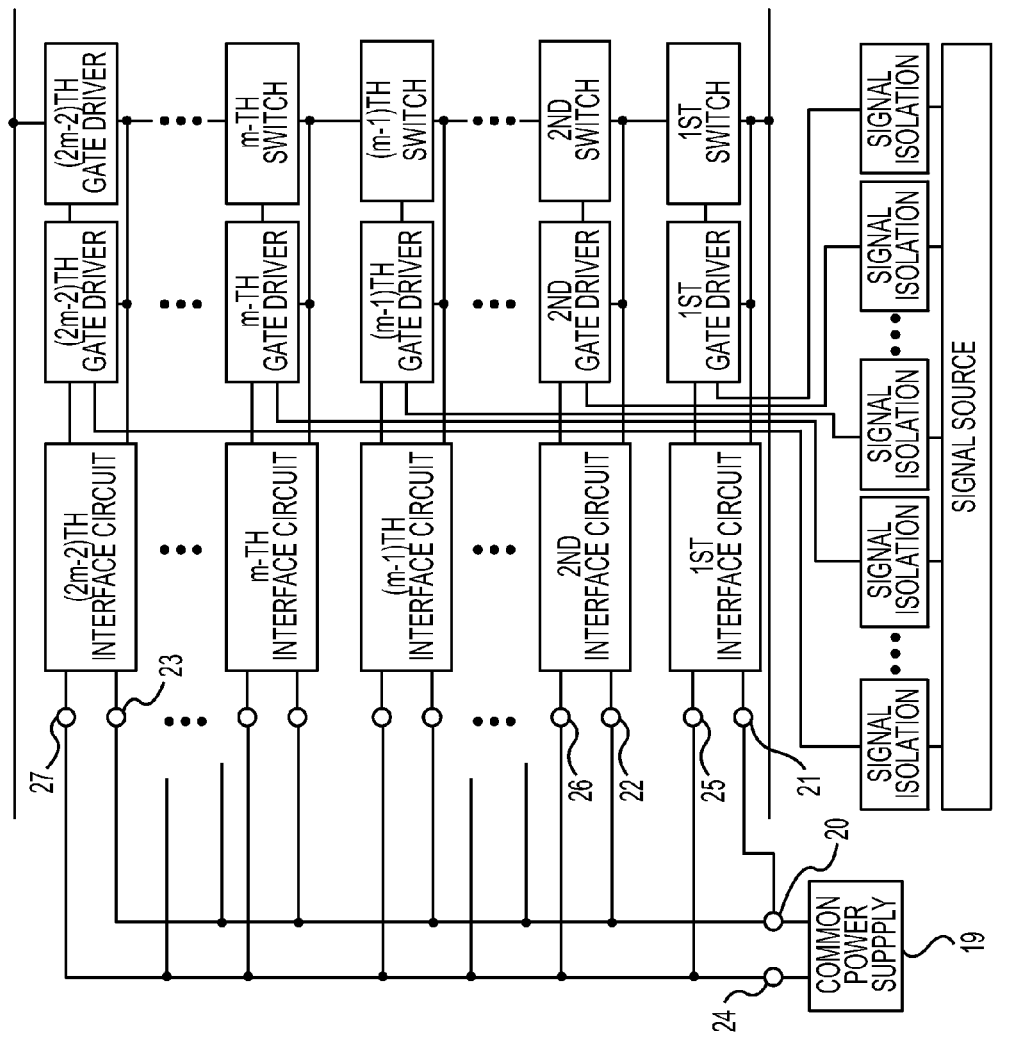
FIG. 15 is a diagram showing a configuration that includes a single common power supply connected in parallel to each interface circuit.

FIG. 15 shows a gate drive circuit of the multilevel power converter for supplying power to the gate drivers by connecting the interface circuit of FIG. 1 to a single common power supply 19 and other interface circuits. On the one hand, a power supply terminal 21 of the first interface circuit, a power supply terminal 22 of the second interface circuit and a power supply terminal 23 of the (2m−2)th interface circuit are connected to a ground side terminal 20 of the common power supply 19, while on the other, a power supply terminal 25 of the first interface circuit, a power supply terminal 26 of the second interface circuit and a power supply terminal 27 of the (2m−2)th interface circuit are connected to a high-voltage side terminal 24 of the common power supply 19. Accordingly, power can be supplied from the single common power supply 19 to all of the gate drivers through the interface circuits.

Figure 16:
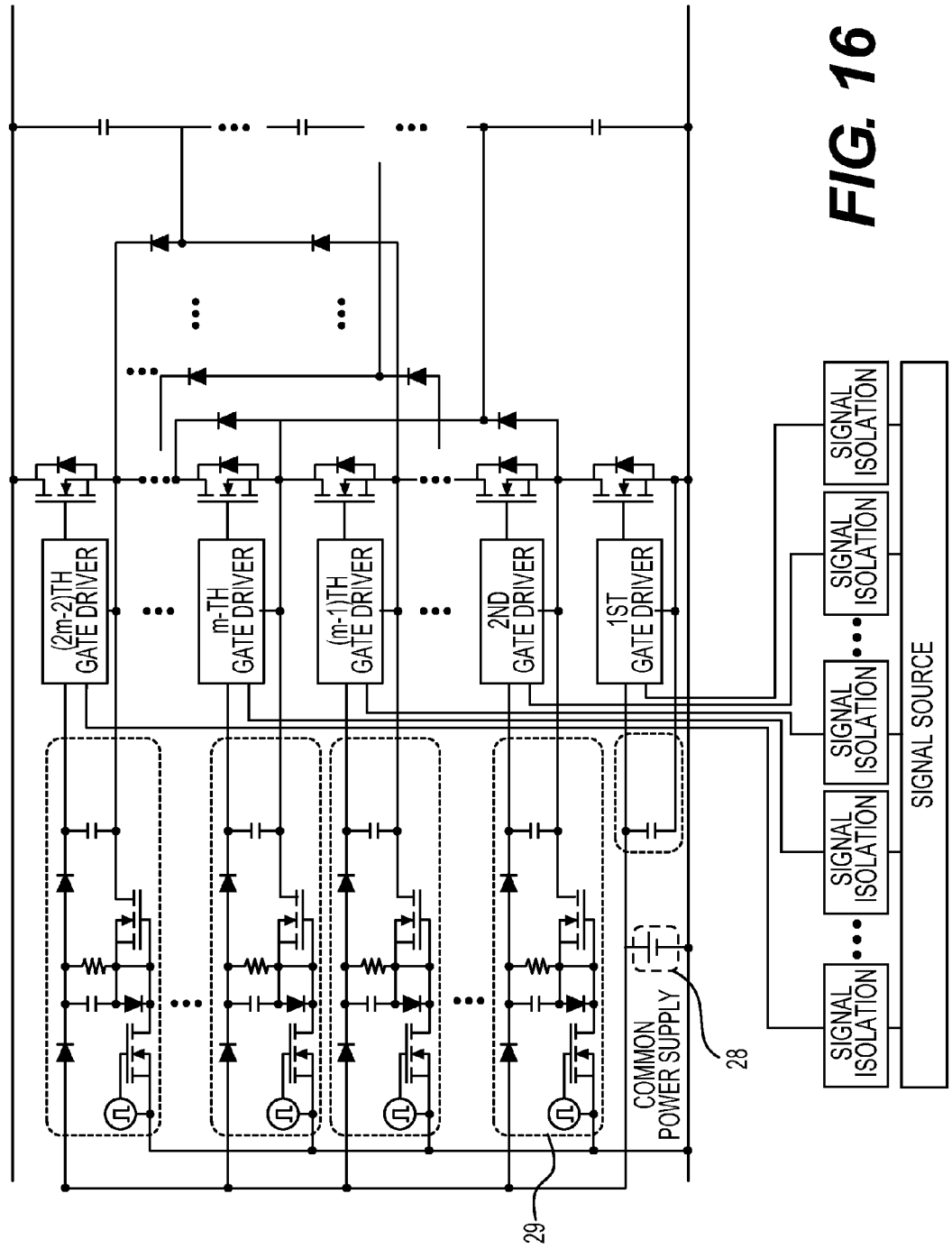
FIG. 16 shows a power conversion apparatus for supplying gate power by parallel connection of a charge pump circuit to a diode-clamp multilevel power conversion circuit.

FIG. 16 shows a diode-clamp multilevel power conversion circuit that includes the interface circuit of FIG. 15 as a charge pump circuit that includes diodes, capacitors, and semiconductor switches. The charge pump circuit charges a high-voltage side capacitor from the power supply or the capacitor on the low voltage side by the switching of a built-in active element. Power is supplied from one common power supply 28 to the second gate driver through the charge pump circuit 29, and power is similarly supplied to each of the other gate drivers through the charge pump circuit. As a result, the high-voltage side capacitor can be charged from the low voltage side without being influenced by the potential change on the low voltage side of each main switch due to the switching of the main circuit. Thus, power can be supplied to all of the gate drivers from a single common power supply 28 without being influenced by the operation of the main circuit.

Figure 17:
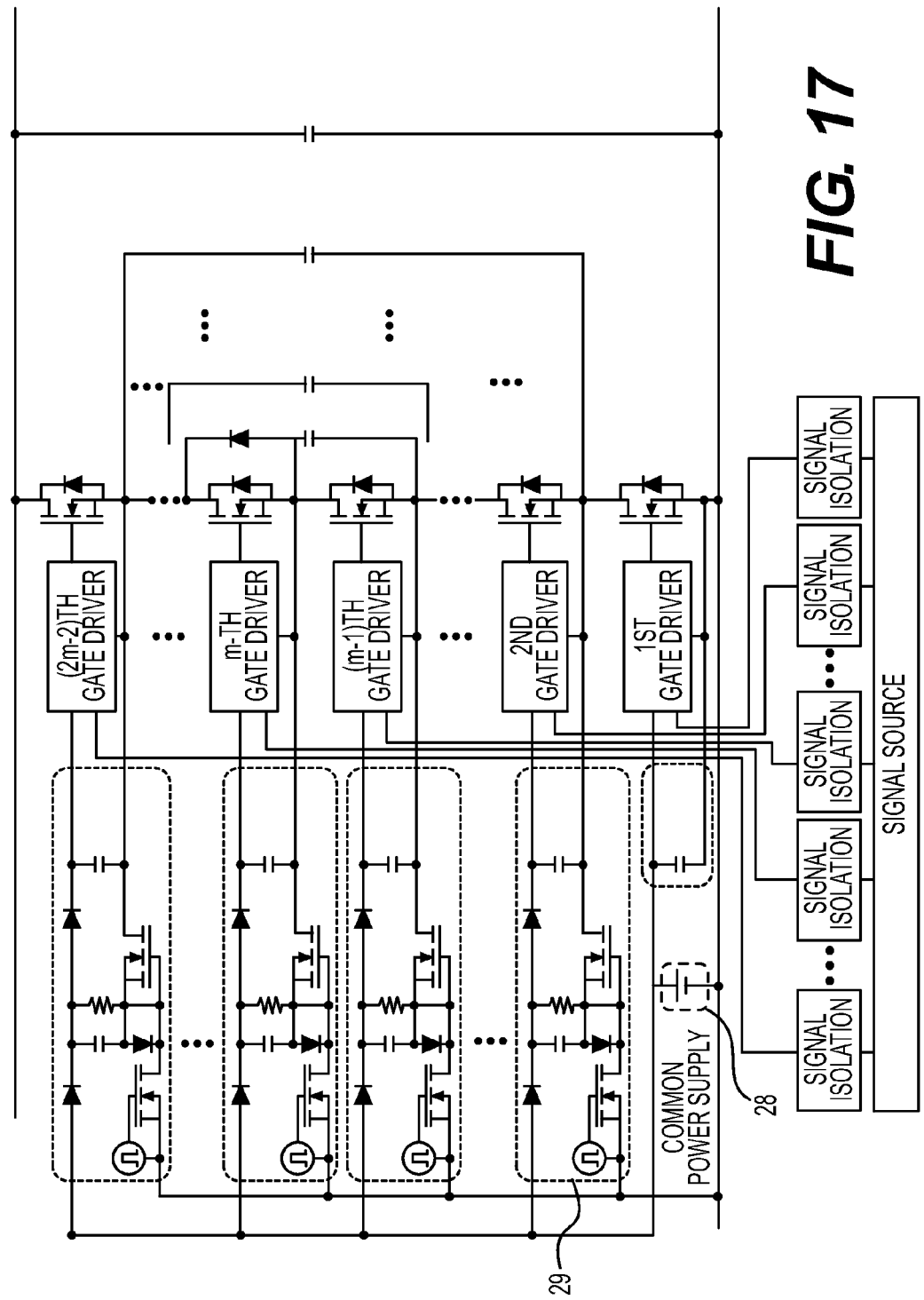
FIG. 17 shows a power conversion apparatus for supplying gate power by parallel connection of a charge pump circuit to a flying-capacitor multilevel power conversion circuit.

FIG. 17 shows a flying-capacitor multilevel power conversion circuit that includes the interface circuit of FIG. 15 as a charge pump circuit that includes diodes, capacitors, and semiconductor switches. Power is supplied from the single common power supply 28 to the second gate driver through the charge pump circuit 29, and similarly, power is supplied to the other gate drivers through the charge pump circuit. As a result, the high-voltage side capacitor can be charged from the low voltage side without being influenced by the potential change on the low voltage side of each main switch due to the switching of the main circuit. Therefore, power can be supplied to all of the gate drivers from the single common power supply 28 without being influenced by the operation of the main circuit.

(Example 3 of Power Supply to Gate Drivers)

Figure 18:
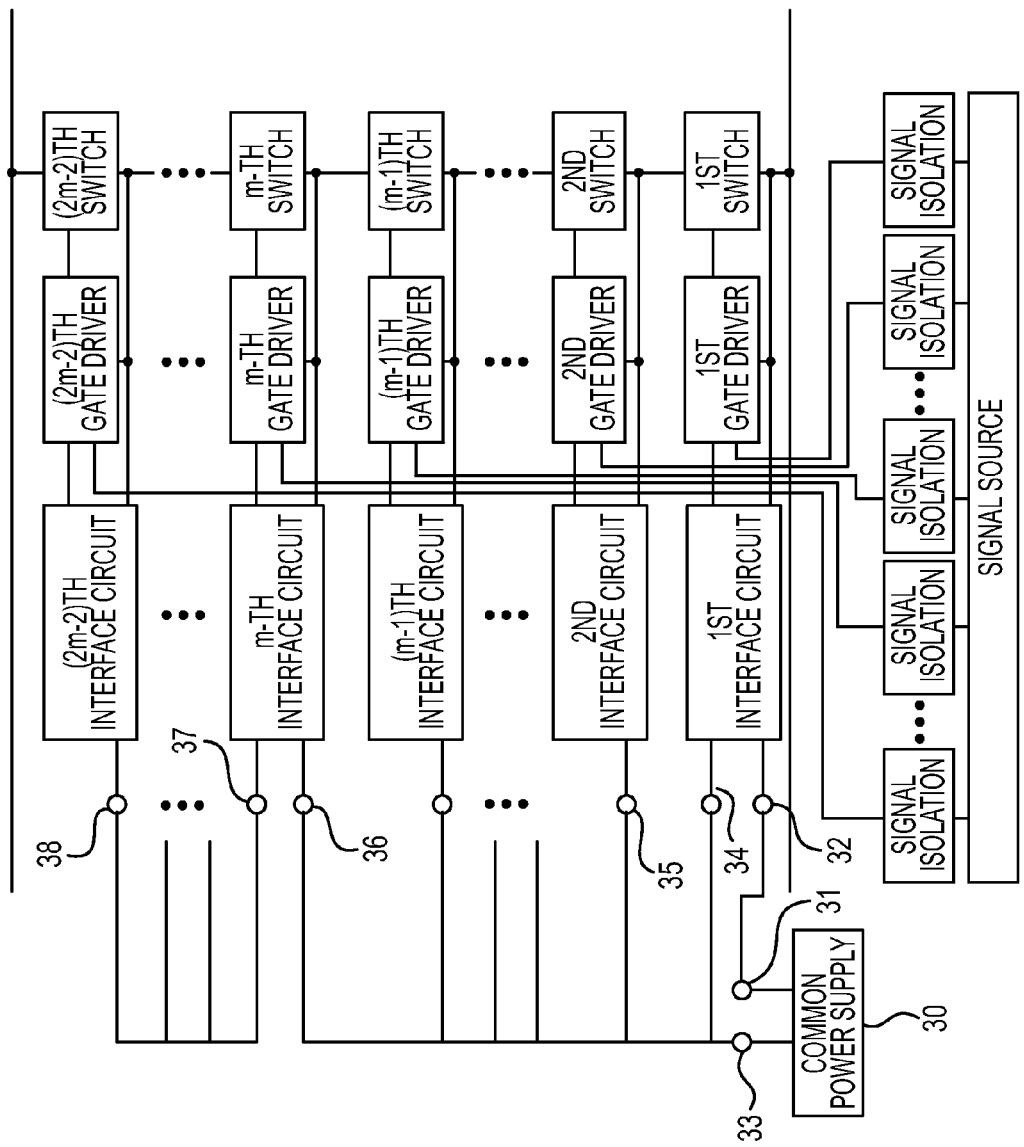
FIG. 18 is a diagram showing the configuration for supplying gate power to each interface circuit through an intermediate stage with a single common power supply.

FIG. 18 shows a gate drive circuit of a multilevel power converter for supplying power to the gate drivers by connecting the interface circuit of FIG. 1 to one common power supply 30 or other interface circuits. A power supply terminal 32 of a first interface circuit is connected to a ground side terminal 31 of a common power supply 30, while a power supply terminal 34 of the first interface circuit, a power supply terminal 35 of the second interface circuit and a power supply terminal 36 of an m-th interface circuit are connected to a high voltage side terminal 33 of the common power supply 30. Further, a power supply terminal 37 of the m-th interface circuit and the terminals up to and that includes a power supply terminal 38 of a (2m−2)th interface circuit in the upper stage are connected to each other. As a result, power can be supplied from the single common power supply 30 to all of the gate drivers through each interface circuit.

Figure 19:
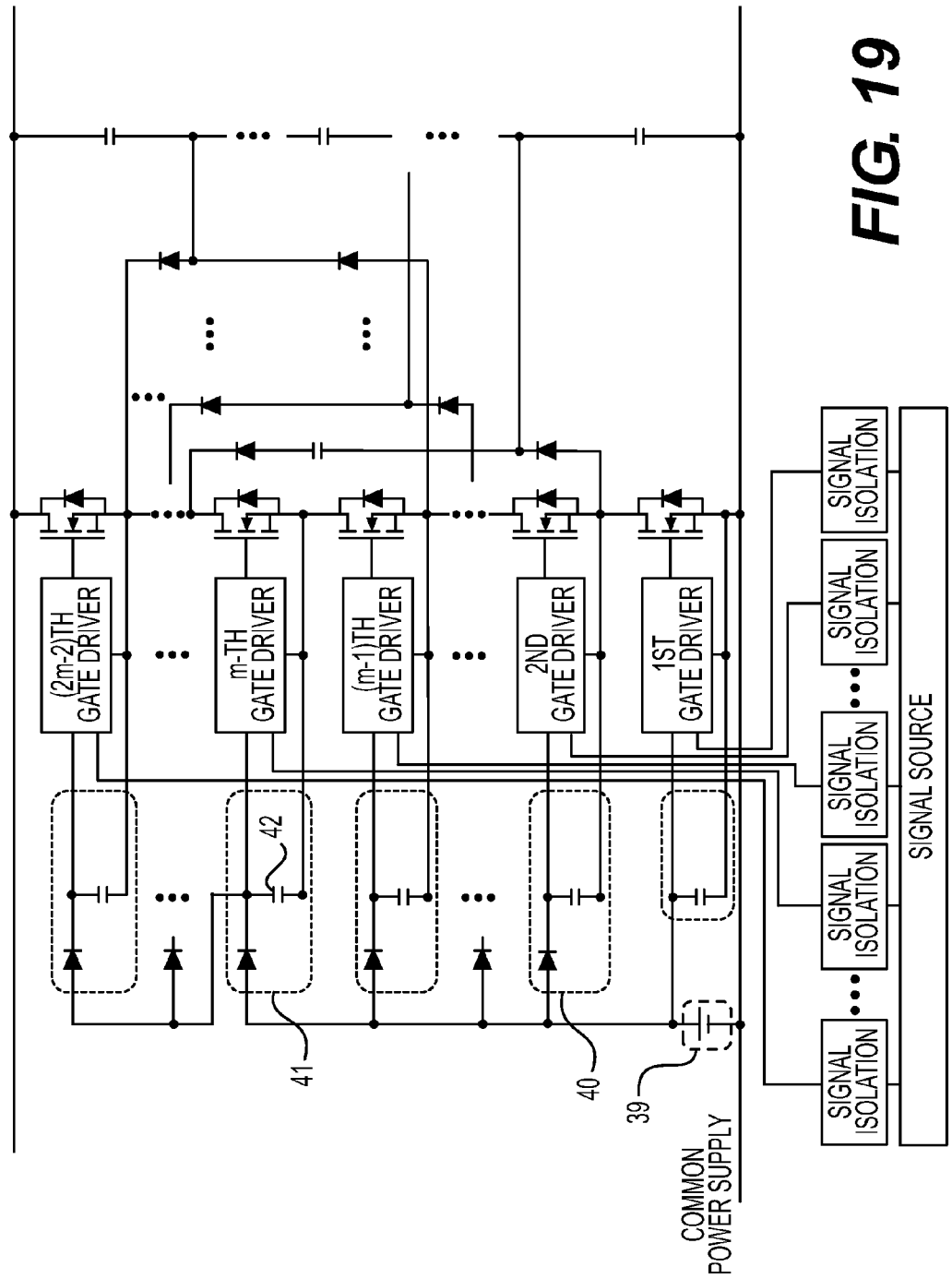
FIG. 19 shows a power conversion apparatus for supplying gate power to a diode-clamp multilevel power conversion circuit by both parallel and series connection of a bootstrap circuit.

FIG. 19 shows a diode-clamp multilevel power conversion circuit that includes the interface circuit of FIG. 18 as a bootstrap circuit that includes a diode and a capacitor. Power is supplied from a single common power supply 39 to the second gate driver through a bootstrap circuit 40, and similarly, power is supplied to other gate drivers up to the m-th gate driver through the bootstrap circuit. Further, power is supplied from the capacitor 42 in the bootstrap circuit 41 connected to the m-th gate driver to the (m+1)th to (2m−2)th gate drivers through the bootstrap circuit in each stage. As a result, the number of diodes through which power is supplied to each gate driver is reduced to one or two regardless of the number m of levels. Thus, power can be supplied from the single common power supply 39 to all of the gate drivers.

Figure 20:
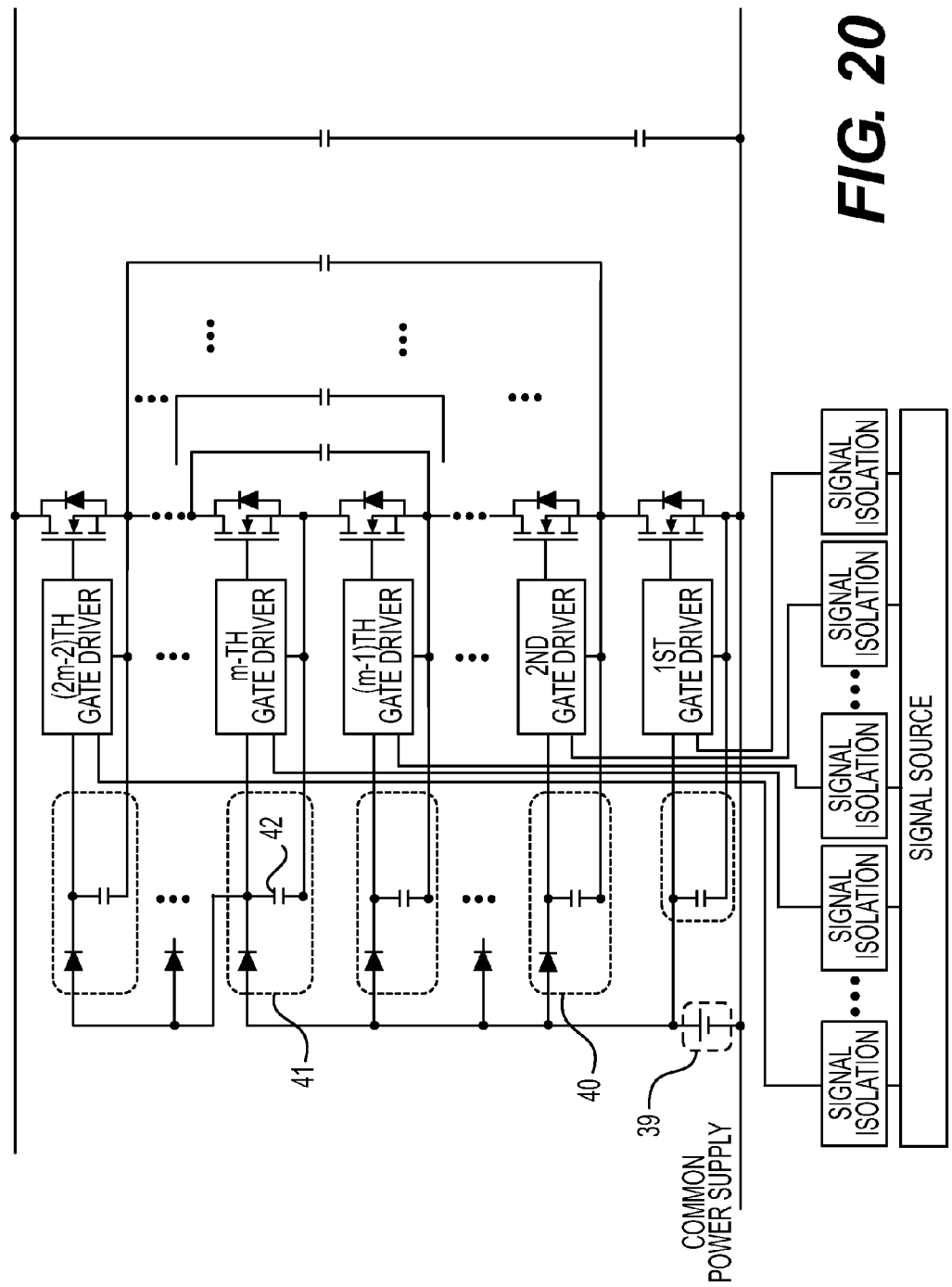
FIG. 20 shows a power conversion apparatus for supplying gate power to a flying-capacitor multilevel power conversion circuit by both parallel and series connection of a bootstrap circuit.

FIG. 20 shows a flying-capacitor multilevel power conversion circuit that includes the interface circuit of FIG. 18 as a bootstrap circuit that includes a diode and a capacitor. Power is supplied from a single common power supply 39 to the second gate driver through the bootstrap circuit 40, and similarly power is supplied to other gate drivers up to the m-th gate driver through the bootstrap circuit. Further, power is supplied from the capacitor 42 in the bootstrap circuit 41 connected to the m-th gate driver to the (m+1)th to (2m−2)th gate drivers through the bootstrap circuit in each stage. As a result, the number of diodes through which power is supplied to each gate driver is reduced to one or two regardless of the number m of levels. Thus, power can be supplied from the single common power supply 39 to all of the gate drivers.

(Example 4 of Power Supply to Gate Drivers)

Figure 21:
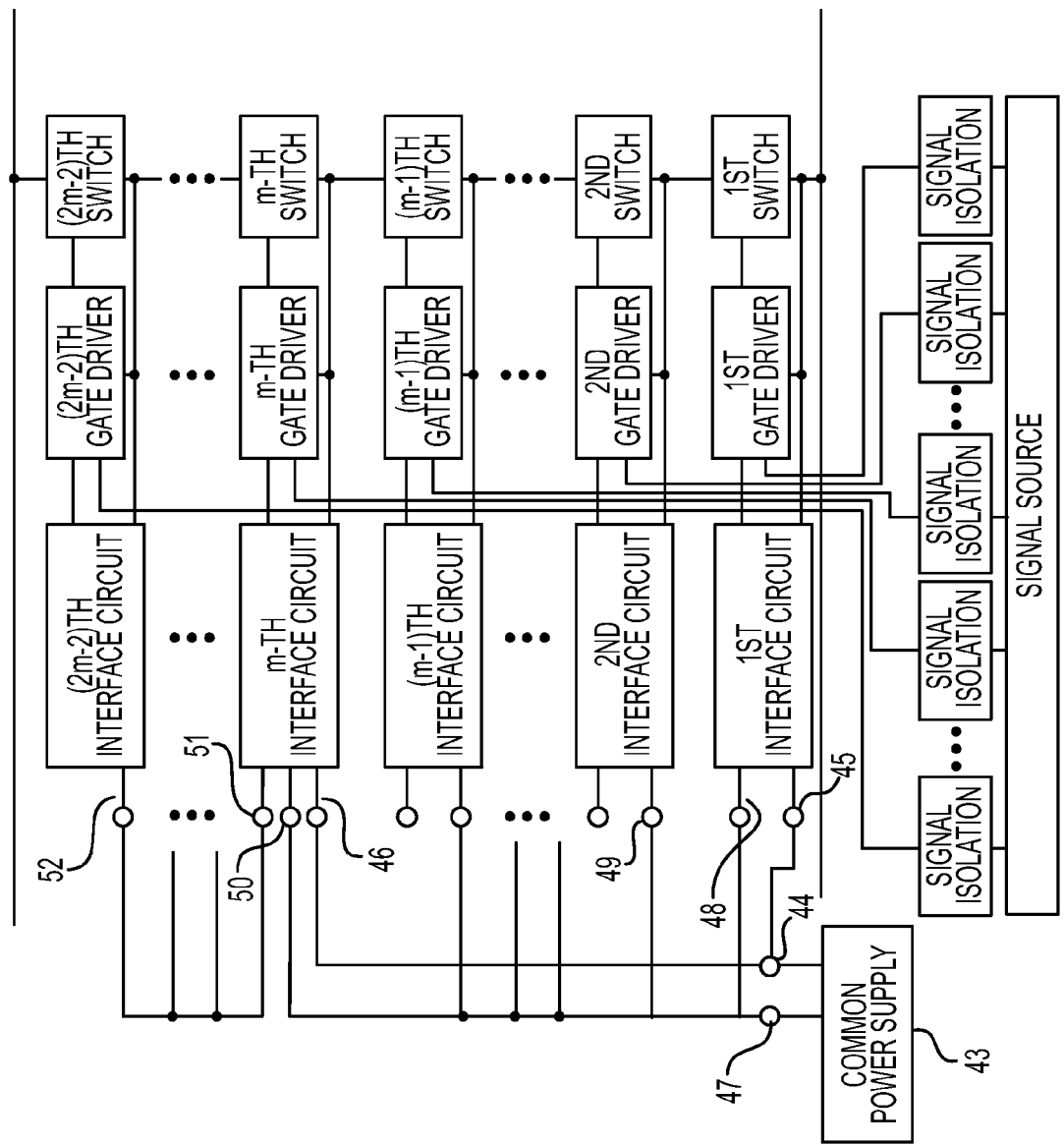
FIG. 21 is a diagram showing the configuration for supplying gate power to each interface circuit through an intermediate stage with a single common power supply.

FIG. 21 shows the gate drive circuit of the multilevel power converter for supplying power to the gate drivers by connecting the interface circuit of FIG. 1 to a single common power circuit 43 and other interface circuits. A power supply terminal 45 of the first interface circuit and a power supply terminal 46 of the m-th interface circuit are connected to a ground side terminal 44 of the common power supply 43, while a power supply terminal 48 of the first interface circuit, a power supply terminal 49 of the second interface circuit and a power supply terminal 50 of the m-th interface circuit are connected to a high voltage side terminal 47 of a common power supply 43. Further, a power supply terminal 51 of the m-th interface circuit is connected to a power supply terminal 52 of an upper (2m−2)th interface circuit. As a result, power can be supplied from the single common power supply 43 to all of the gate drivers through the respective interface circuits.

Figure 22:
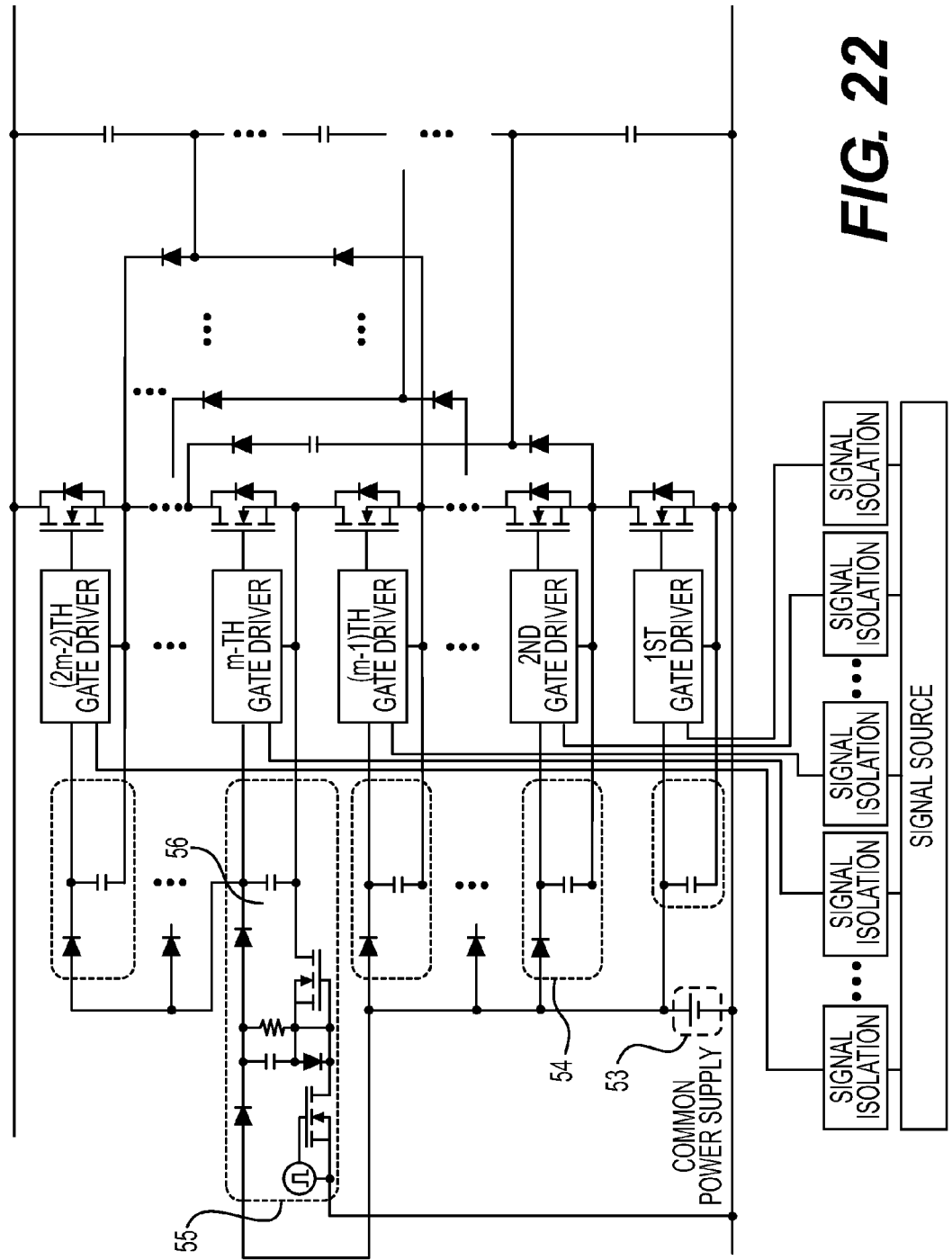
FIG. 22 shows a power conversion apparatus for supplying gate power to a diode-clamp multilevel power conversion circuit by parallel connection of a bootstrap circuit with a charge pump circuit.

FIG. 22 shows a diode-clamp multilevel power conversion circuit that includes the interface circuit of FIG. 21 as a bootstrap circuit that includes a diode and a capacitor, together with a charge pump circuit that includes diodes, capacitors, and semiconductor switches. Power is supplied from a single common power supply 53 to the second gate driver through the bootstrap circuit 54, and similarly, power is supplied to other gate drivers up to the (m−1)th gate driver through the bootstrap circuit. Also, the charge pump circuit 55 supplies the m-th gate driver with power independently of the switching of the main circuit. Further, the (m+1)th to (2m−2)th gate drivers are supplied with power through the bootstrap circuit in each stage from the capacitor 56 in the charge pump circuit 55 connected to the m-th gate driver. As a result, the number of diodes through which power is supplied to each gate driver can be reduced to one or three regardless of the number m of levels. Furthermore, power can be supplied stably to the m-th to (2m−2)th gate drivers. Thus, power can be supplied from the single common power supply 53 to all of the gate drivers.

Figure 23:
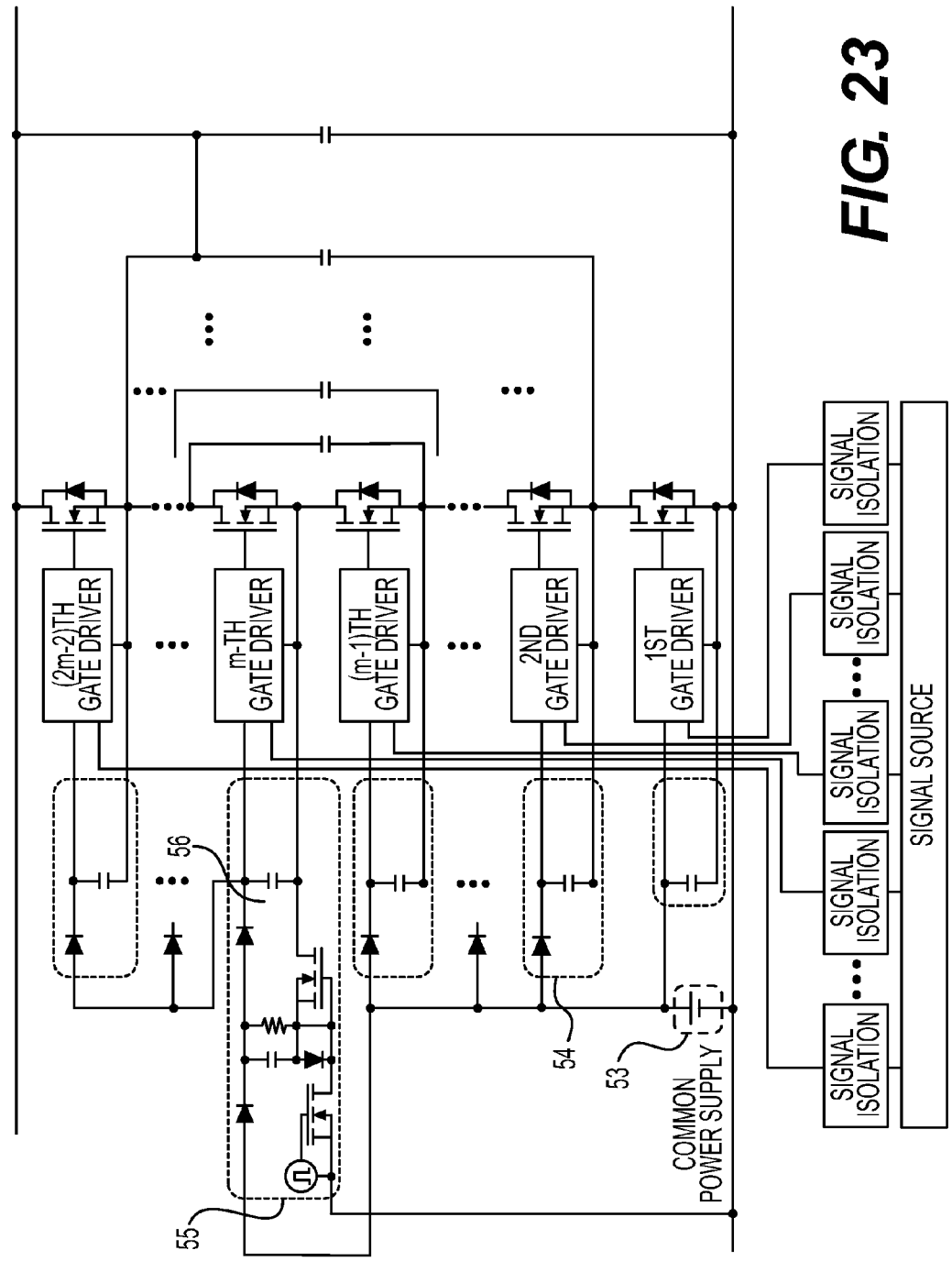
FIG. 23 shows a power conversion apparatus for supplying the gate power to a flying-capacitor multilevel power conversion circuit by parallel connection of a bootstrap circuit with a charge pump circuit.

FIG. 23 shows a flying-capacitor multilevel power conversion circuit that includes the interface circuit of FIG. 21 as a bootstrap circuit that includes a diode and a capacitor, together with a charge pump circuit that includes diodes, capacitors, and semiconductor switches. Power is supplied from a single common power supply 53 to the second gate driver through the bootstrap circuit 54, and similarly, power is supplied to other gate drivers up to the (m−1)th gate driver through the bootstrap circuit. Also, the charge pump circuit 55 supplies the m-th gate driver with power independently of the switching of the main circuit. Further, the capacitor 56 in the charge pump circuit 55 connected to the m-th gate driver supplies power to the (m+1)th to (2m−2)th gate drivers through the bootstrap circuit. As a result, the number of diodes through which power is supplied to each gate driver can be reduced to one or three regardless of the number m of levels. Furthermore, power can be supplied stably to the m-th to (2m−2)th gate drivers. Thus, power can be supplied from the single common power supply 53 to all of the gate drivers.

(Example 5 of Power Supply to Gate Drivers)

Figure 24:
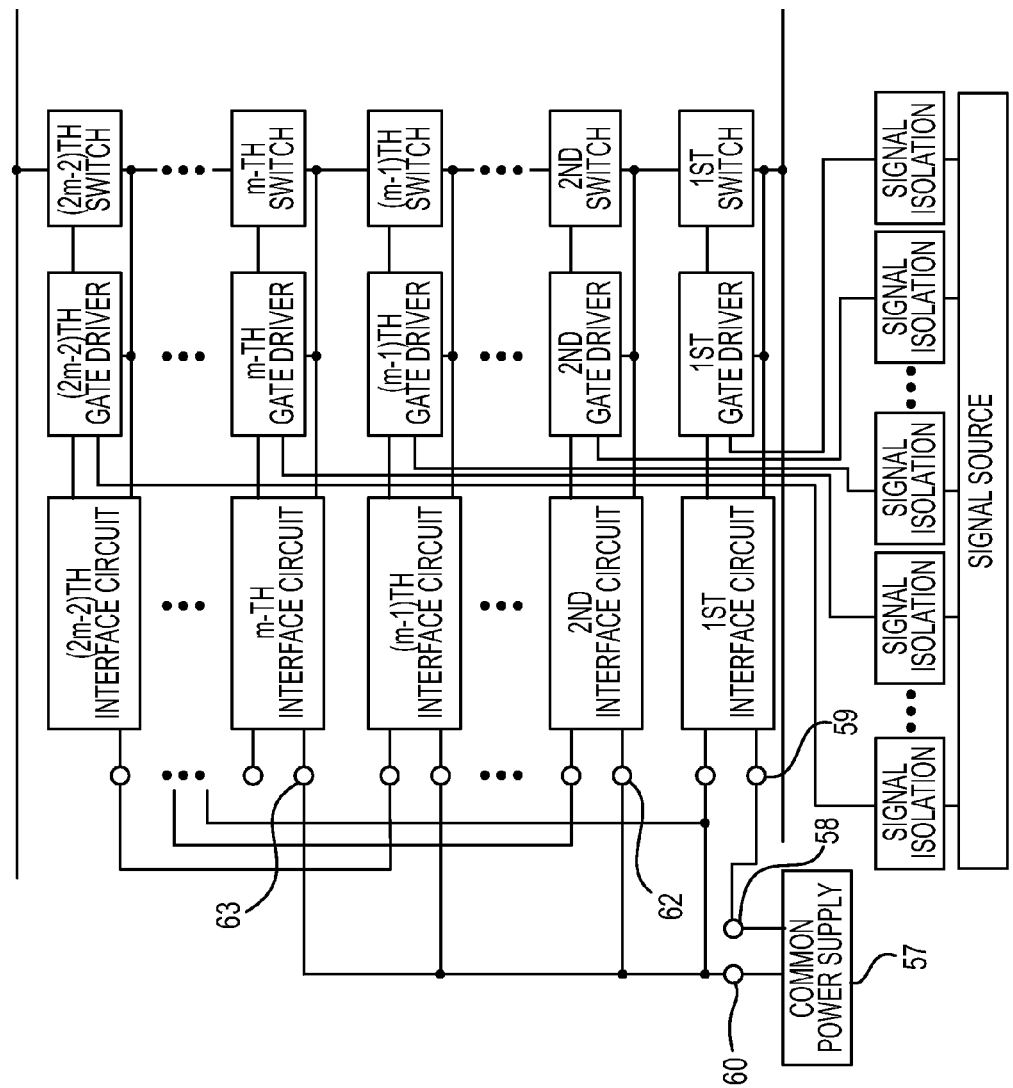
FIG. 24 is a diagram showing the configuration for supplying gate power to each interface circuit through distributed intermediate stages with a single common power supply.

FIG. 24 shows a gate drive circuit of the multilevel power converter for supplying power to the gate drivers by connecting the interface circuit of FIG. 1 to one common power supply 57 and the other interface circuits. A power supply terminal 59 of the first interface circuit is connected to a ground side terminal 58 of a common power supply 57, while a power supply terminal 61 of the first interface circuit, a power supply terminal 62 of the second interface circuit and a power supply terminal 63 of the m-th interface circuit are connected to a high voltage side terminal 60 of the common power supply 57. Further, the power supply terminals of the second to (m−1)th interface circuits are connected with those of the interface circuits of the (m−1)th and upper stages. As a result, power can be supplied from the single common power supply 57 to all of the gate drivers through each interface circuit.

Figure 25:
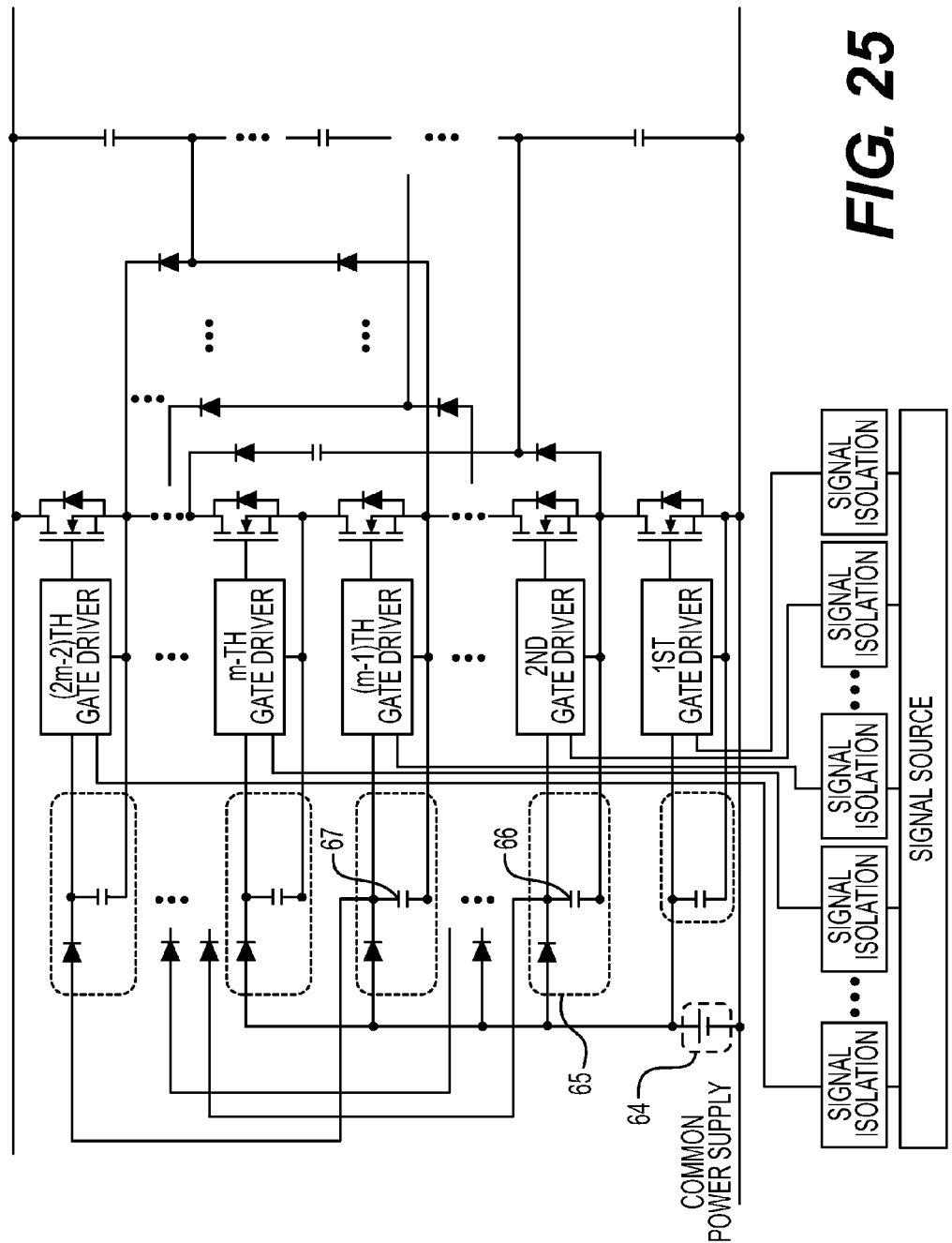
FIG. 25 shows a power conversion apparatus for supplying gate power to a diode-clamp multilevel power conversion circuit by parallel and series connection of a bootstrap circuit.

FIG. 25 shows a diode-clamp multilevel power conversion circuit that includes the interface circuit of FIG. 24 as a bootstrap circuit that includes a diode and a capacitor. Power is supplied from a single common power supply 64 to the second gate driver through the bootstrap circuit 65, and similarly, power is supplied to other gate drivers up to the m-th one through the bootstrap circuit. Power is also supplied from the capacitors 66, 67 in the bootstrap circuit connected to the second to (m−1)th gate drivers through the bootstrap circuit to the (m+1)th to (2m−2)th gate drivers. As a result, the number of diodes through which power is supplied to each gate driver can be reduced to one or two regardless of the number m of levels. Thus, power can be supplied from the single common power supply 64 to all of the gate drivers.

Figure 26:
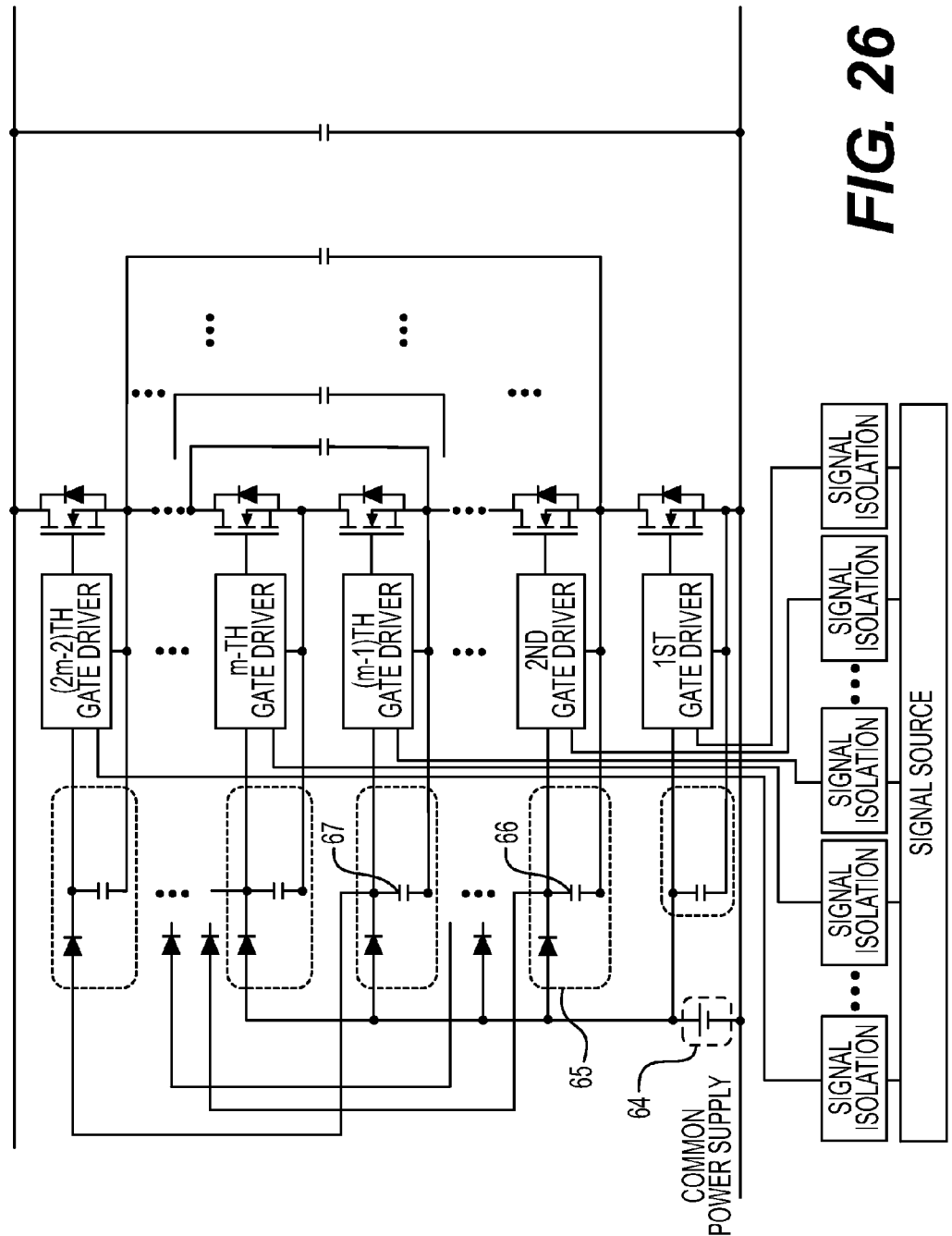
FIG. 26 shows a power conversion apparatus for supplying gate power to a flying-capacitor multilevel power conversion circuit by parallel and series connection of a bootstrap circuit.

FIG. 26 shows a flying-capacitor multilevel power conversion circuit that includes the interface circuit of FIG. 24 as a bootstrap circuit that includes a diode and a capacitor. Power is supplied from a single common power supply 64 to the second gate driver through the bootstrap circuit 65, and similarly, power is supplied through the bootstrap circuit to other gate drivers up to the m-th gate driver. Power is also supplied from the capacitors 66, 67 in the bootstrap circuit connected to the second to (m−1)th gate drivers through the bootstrap circuit to the (m+1)th to (2m−2)th gate drivers. As a result, the number of diodes through which power is supplied to each gate driver can be reduced to one or two regardless of the number m of levels, and power can be supplied from the single common power supply 64 to all of the gate drivers.

(Example 6 of Power Supply to Gate Drivers)

Figure 27:
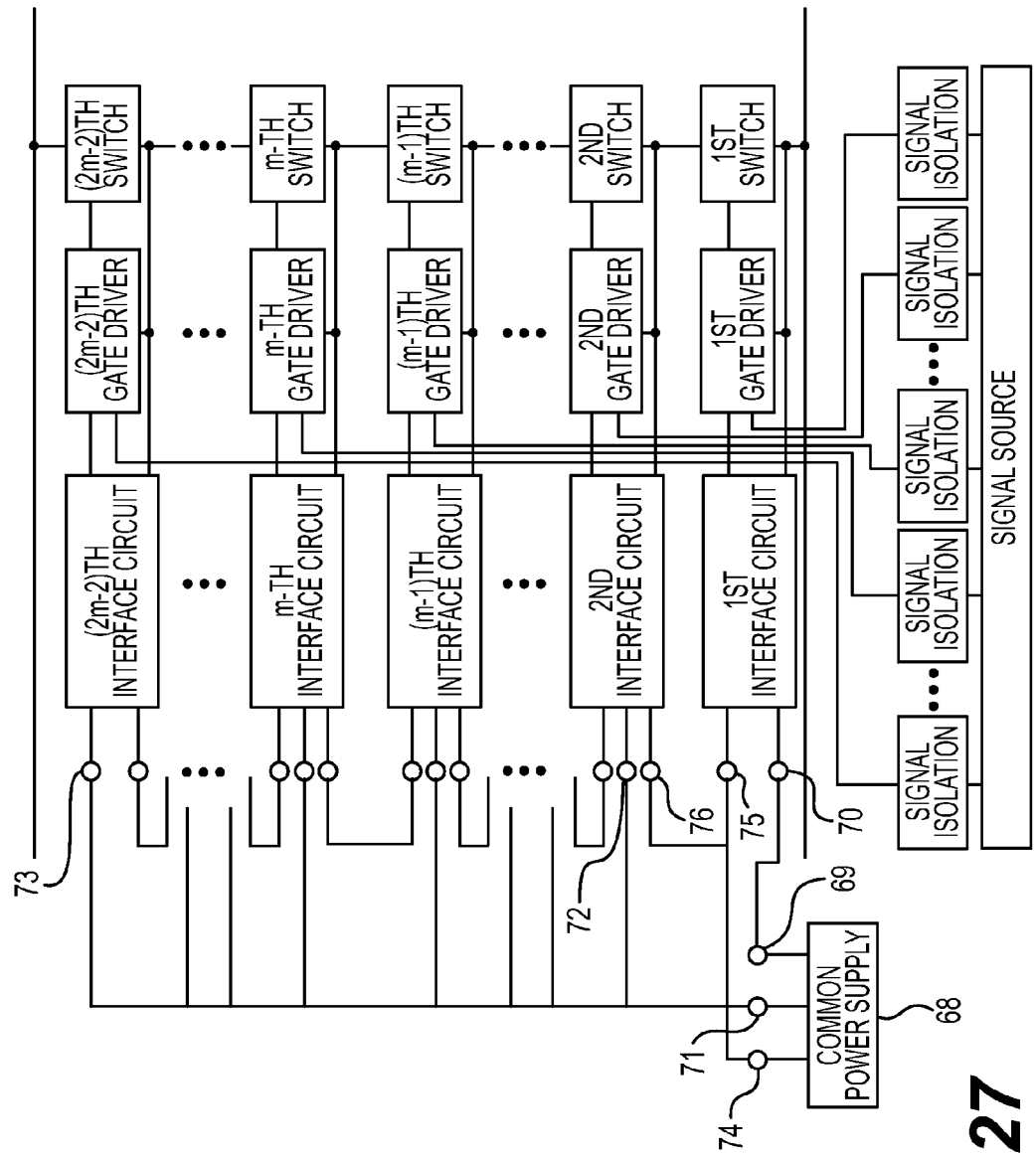
FIG. 27 is a diagram showing a configuration that includes a single common power supply and interface circuits connected in a series.

FIG. 27 shows a gate drive circuit of the multilevel power converter for supplying power to the gate drivers by connecting the interface circuit of FIG. 1 to one common power supply 68 or other interface circuits. The common power supply has three terminals. Numeral 74 designates a high voltage side terminal of the power supply, numeral 69 a ground side terminal of the power supply, and numeral 71 a ground side terminal connected to the high voltage side of the switching element for controlling the charge/discharge of the interface circuit. The low voltage side of the switching element has the same potential as that of the ground side terminal. A power supply terminal 70 of the first interface circuit is connected to a ground side terminal 69 of a common power supply 68, and a power supply terminal of each interface circuit that includes a power supply terminal 72 of the second interface circuit, up to the power supply terminal 73 of the (2m−2)th interface circuit is connected to the ground side terminal 71 of the common power supply 68. Also, a power supply terminal 75 of the first interface circuit and a power supply terminal 76 of the second interface circuit are connected to a high voltage side terminal 74 of the common power supply 68. Further, the second to (2m−2)th interface circuits are each connected to one power supply terminal. As a result, power can be supplied from the single common power supply 68 to all of the gate drivers through each interface circuit.

Figure 28:
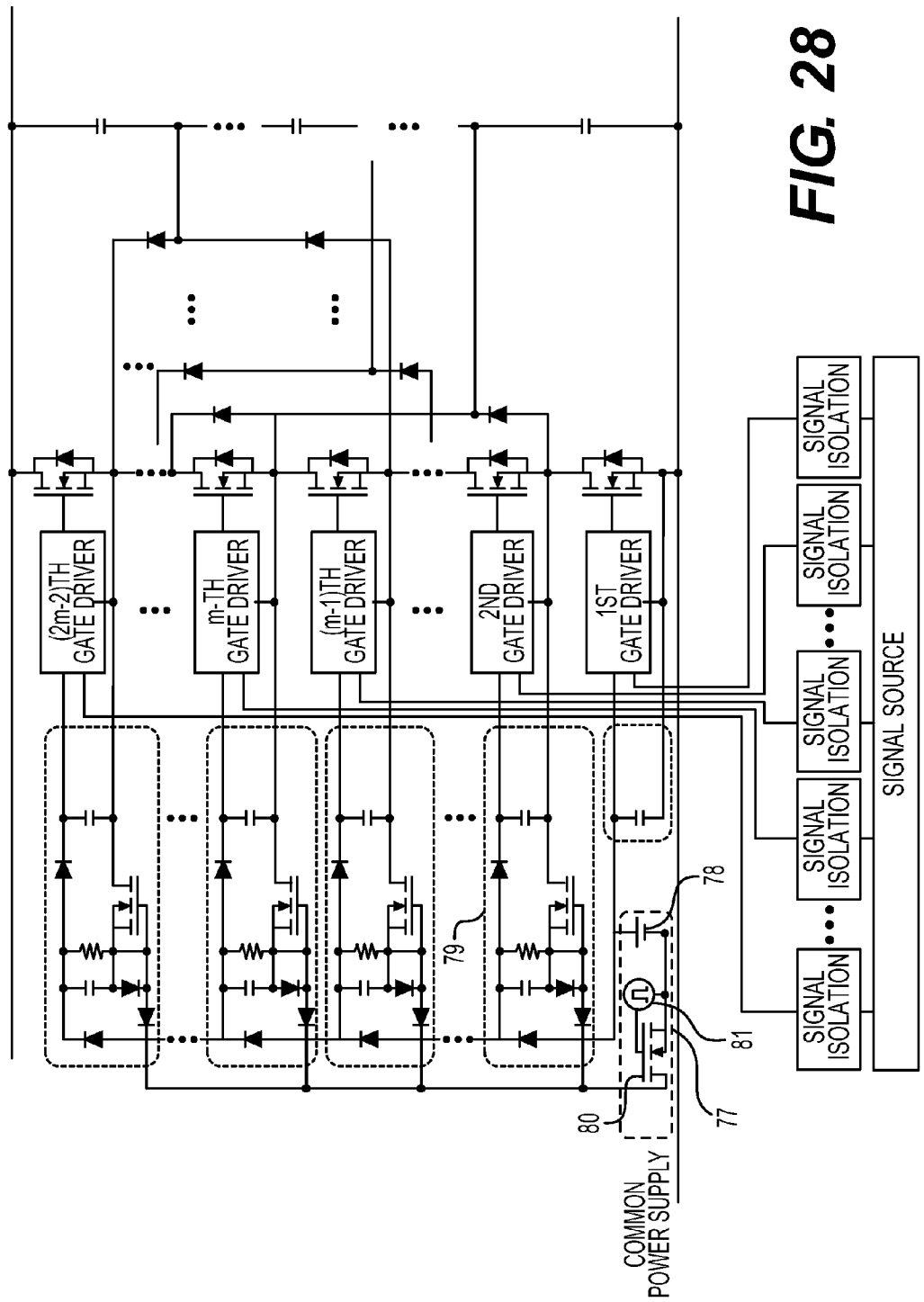
FIG. 28 shows a power conversion apparatus for supplying gate power to a diode-clamp multilevel power conversion circuit by series connection of a charge pump circuit.

FIG. 28 shows a diode-clamp multilevel power conversion circuit that includes the interface circuit of FIG. 27 as a charge pump circuit that includes diodes, capacitors, and semiconductor switches. Power is supplied from a single common power supply 78 to the second gate driver through the charge pump 79, and similarly, power is supplied through the charge pump circuit to other gate drivers up to the (2m−2) gate driver. The semiconductor switch 80 and the signal generator 81 required for the charge pump circuit are shared, and are therefore installed in the common power supply unit 77. As a result, a signal generator is not required for the interface circuit. Thus, the configuration of each interface circuit is simplified, and power can be supplied from the single common power supply 78 to all of the gate drivers.

Figure 29:
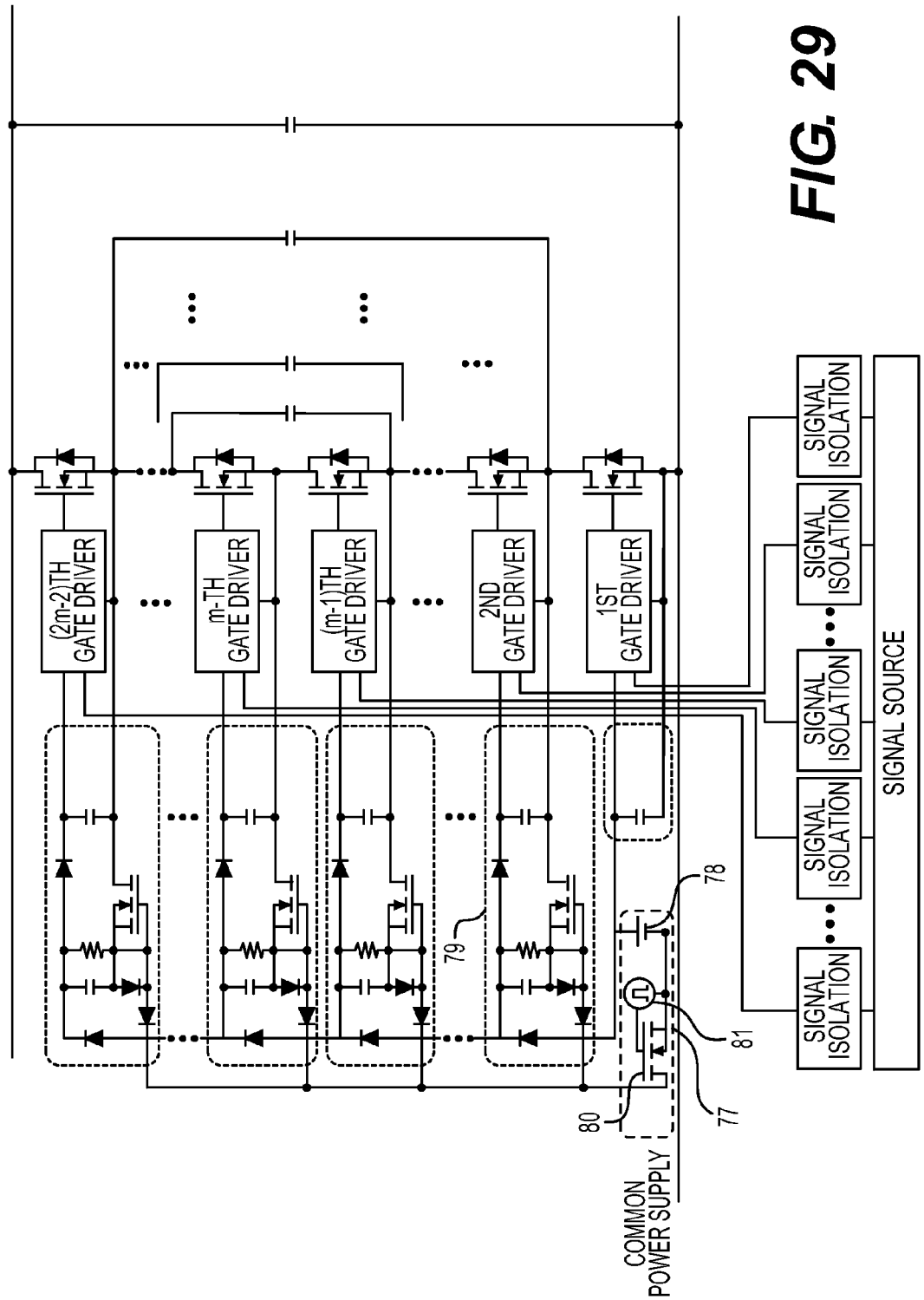
FIG. 29 shows a power conversion apparatus for supplying gate power to a flying-capacitor multilevel power conversion circuit by series connection of a charge pump circuit.

FIG. 29 shows a flying-capacitor multilevel power conversion circuit that includes the interface circuit of FIG. 27 as a charge pump circuit that includes diodes, capacitors, and semiconductor switches. Power is supplied from a single common power supply 78 to the second gate driver through the charge pump 79, and similarly, power is supplied through the charge pump circuit to other gate drivers up to the (2m−2) gate driver. The semiconductor switch 80 and the signal generator 81 required for the charge pump circuit are shared and are therefore installed in the common power supply 78. As a result, the interface circuit does not need to include a signal generator independent of the switching of the main circuit. Thus, the configuration of each interface circuit is simplified, and power can be supplied from the single common power supply 78 to all of the gate drivers.

(Example 7 of Power Supply to Gate Drivers)

Figure 30:
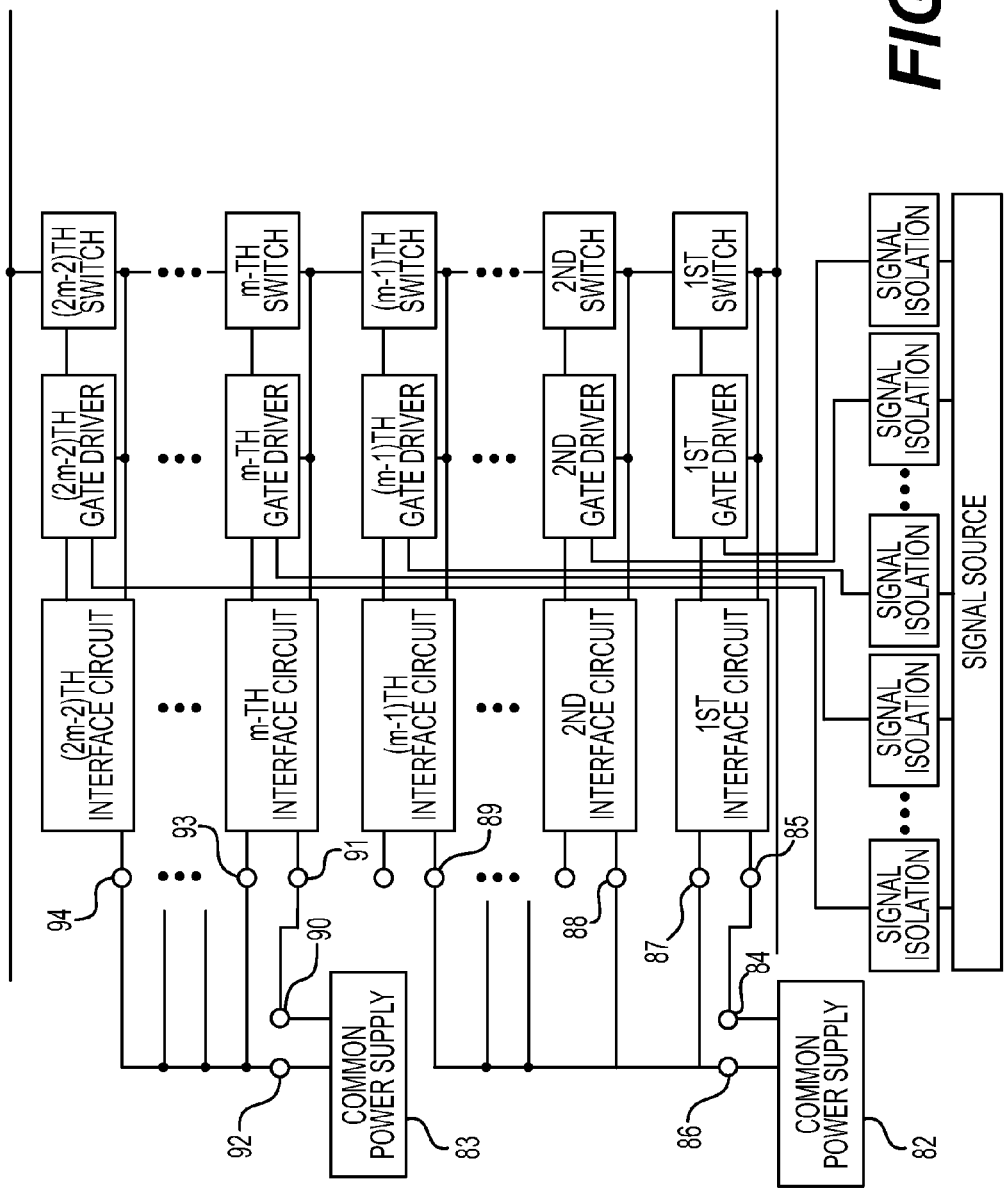
FIG. 30 is a diagram showing a configuration that includes two common power supplies connected in parallel to each interface circuit.

FIG. 30 shows a gate drive circuit of the multilevel power converter for supplying power to the gate drivers by connecting the interface circuit of FIG. 1 to two common power supplies 82 and 83, or other interface circuits. A power supply terminal 85 of a first interface circuit is connected to a ground side terminal 84 of the common power supply 82, while a power supply terminal 87 of the first interface circuit, a power supply terminal 88 of the second interface circuit and a power supply terminal 89 of the m-th interface circuit are connected to a high voltage side terminal 86 of the common power supply 82. Further, a power supply terminal 91 of the m-th interface circuit is connected to a ground side terminal 90 of the common power supply 83, while a power supply terminal 93 of the m-th interface up to the power supply terminal 94 of the (2m−2)th interface circuit are connected to the high voltage side terminal 92 of the common power supply 83. As a result, power can be supplied from the two common power supplies 82 and 83 to all of the gate drivers through each interface circuit.

Figure 31:
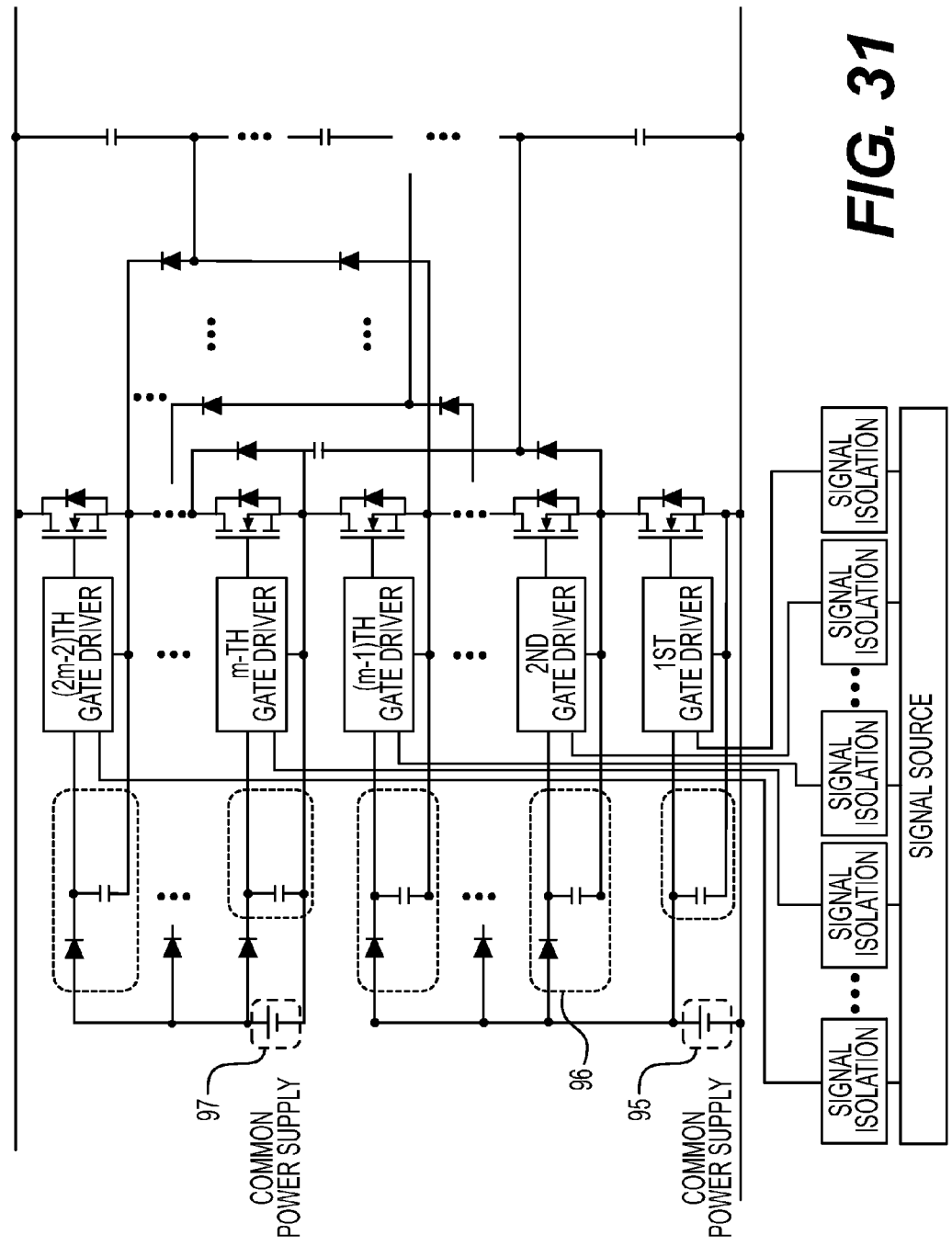
FIG. 31 shows a power conversion apparatus for supplying gate power to a diode-clamp multilevel power conversion circuit by parallel connection of a bootstrap circuit.

FIG. 31 shows a diode-clamp multilevel power converter that includes the interface circuit of FIG. 30 as a bootstrap circuit that includes a diode and a capacitor. Power is supplied from a common power supply 95 to the second gate driver through the bootstrap circuit 96, and similarly, power is supplied to other gate drivers up to the (m−1)th gate driver through the bootstrap circuit. Further, power is supplied from the common power supply 97 connected to the m-th gate driver to the (m+1)th to (2m−2)th gate drivers through the bootstrap circuit of each stage. As a result, the number of diodes through which power is supplied to the gate drivers can be one regardless of the number m of levels, and power can be supplied from the two common power supplies 95 and 97 to all of the gate drivers.

Figure 32:
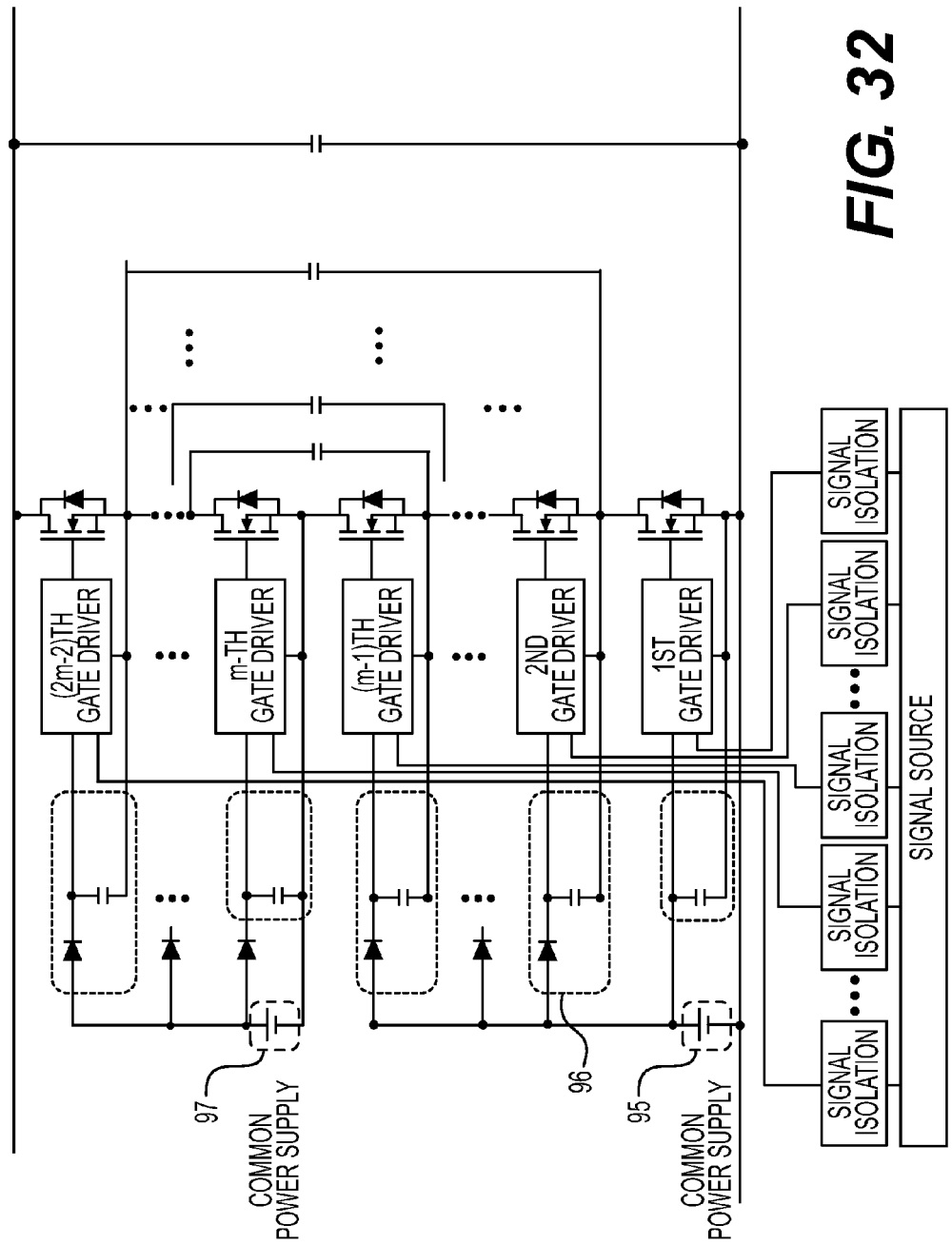
FIG. 32 shows a power conversion apparatus for supplying gate power to a flying-capacitor multilevel power conversion circuit by parallel connection of a bootstrap circuit.

FIG. 32 is a flying-capacitor multilevel power conversion circuit that includes the interface circuit of FIG. 30 as a bootstrap circuit that includes a diode and a capacitor. Power is supplied from a common power supply 95 to the second gate driver through a bootstrap circuit 96, and similarly, power is supplied to other gate drivers up to the (m−1)th gate driver through the bootstrap circuit. Further, power is supplied from a common power supply 97 connected to the m-th gate driver to the (m+1)th to (2m−2)th gate drivers through the bootstrap circuit of each stage. As a result, the number of the diodes through which power is supplied to the gate drivers can be one regardless of the number m of levels, and power can be supplied from the two common power supplies 95 and 97 to all of the gate drivers.

(Example 8 of Power Supply to Gate Drivers)

Figure 33:
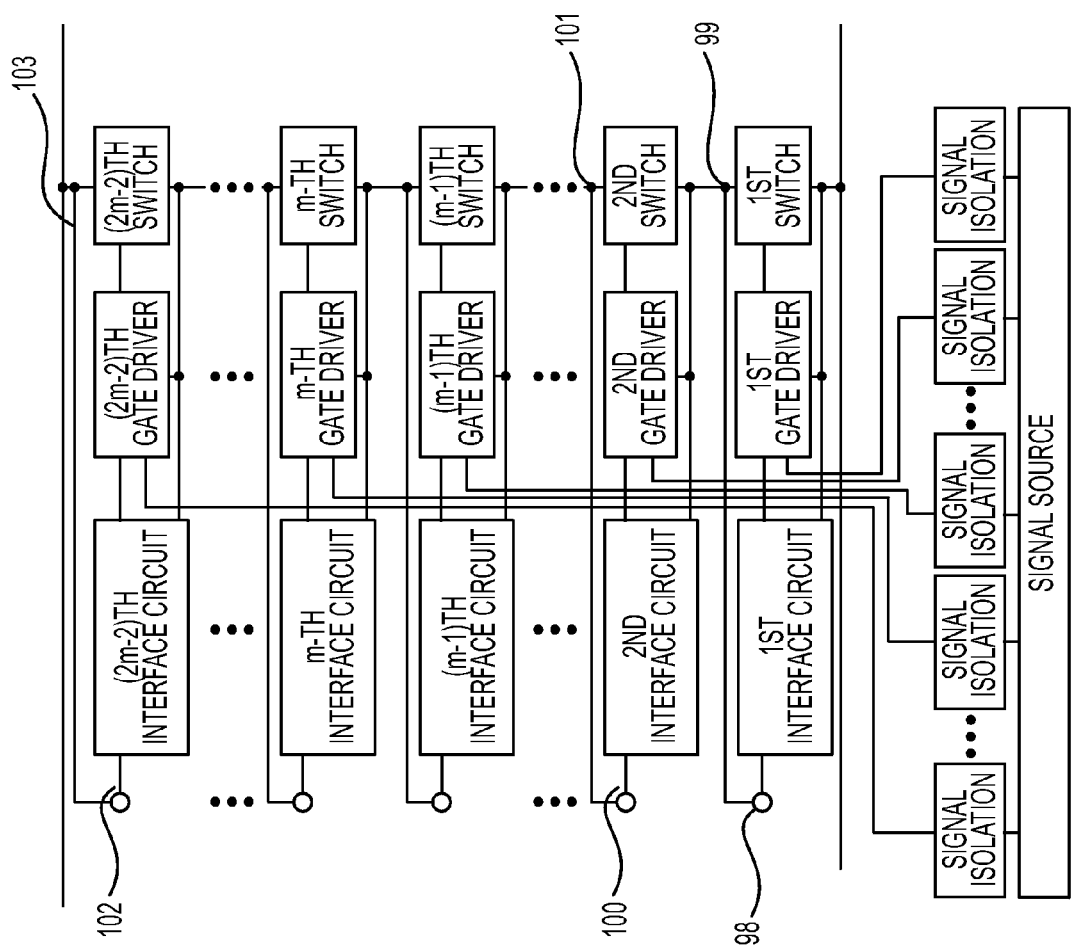
FIG. 33 is a diagram showing the configuration for connecting an interface circuits to a main circuit without using a common power supply.

FIG. 33 shows a gate drive circuit of the multilevel power converter for supplying power to the gate drivers by connecting the interface circuit of FIG. 1 to the main circuit without a common power supply. A power supply terminal 98 of the first interface circuit is connected with a high voltage side terminal 99 of the first switch, and a power supply terminal 100 of the second interface circuit is connected with a high voltage side terminal 101 of the second switch. Similarly, a power supply terminal 102 of the (2m−2)th interface circuit is connected with a high voltage side terminal 103 of the (2m−2)th switch. As a result, power can be supplied to all of the gate drivers through each interface circuit without any common power supply.

Figure 34:
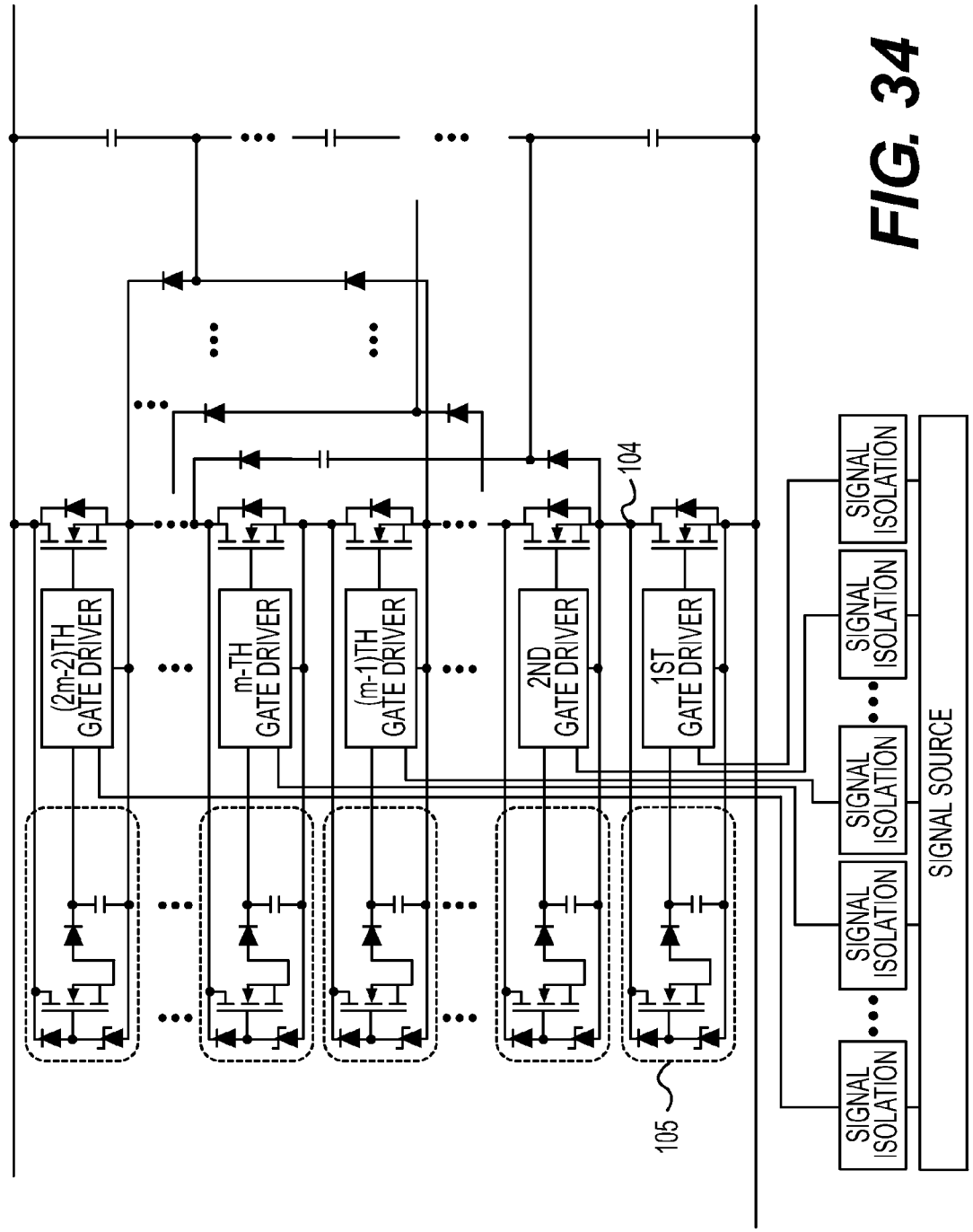
FIG. 34 shows a power conversion apparatus for supplying gate power by connecting a self-feeding circuit to each gate drive unit of a diode-clamp multilevel power conversion circuit.

FIG. 34 shows a diode-clamp multilevel power converter that includes the interface circuit of FIG. 33 as a self-feeding circuit that includes diodes, a zener diode, a capacitor, and a semiconductor switch. The self-feeding circuit supplies power to the gate drivers by charging a built-in capacitor without using a dedicated power supply in accordance with the potential change due to the switching of the semiconductor switch of the main circuit. A high voltage side terminal 104 of each semiconductor switch is connected with a self-feeding circuit 105, and similarly the high voltage side terminals of all the semiconductor switches are connected to the self-feeding circuit. As a result, power can be supplied to all of the gate drivers by utilizing the switching operation of the main circuit without using a common power supply.

Figure 35:
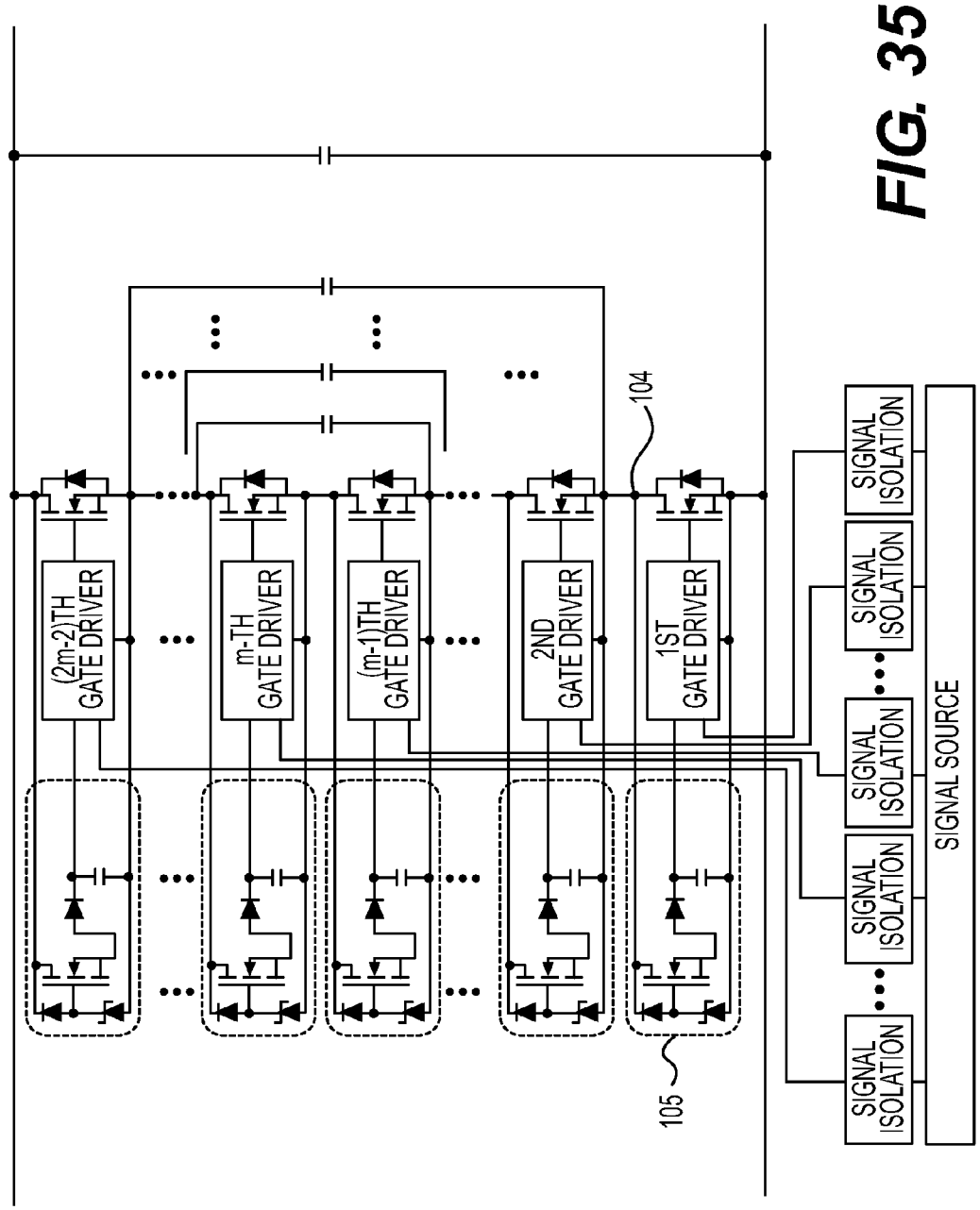
FIG. 35 shows a power conversion apparatus for supplying gate power by connecting a self-feeding circuit to each gate drive unit of a flying-capacitor multilevel power conversion circuit.

FIG. 35 shows a flying-capacitor multilevel power conversion circuit that includes the interface circuit of FIG. 33 as a self-feeding circuit that includes diodes, a zener diode, a capacitor, and a semiconductor switch. The high voltage side terminal 104 of each semiconductor switch is connected to the self-feeding circuit 105, and similarly, —the high voltage side terminals of all the semiconductor switches are connected to the self-feeding circuit. As a result, power can be supplied to all of the gate drivers that by utilizing the switching operation of the main circuit without using a common power supply.

Figure 36:
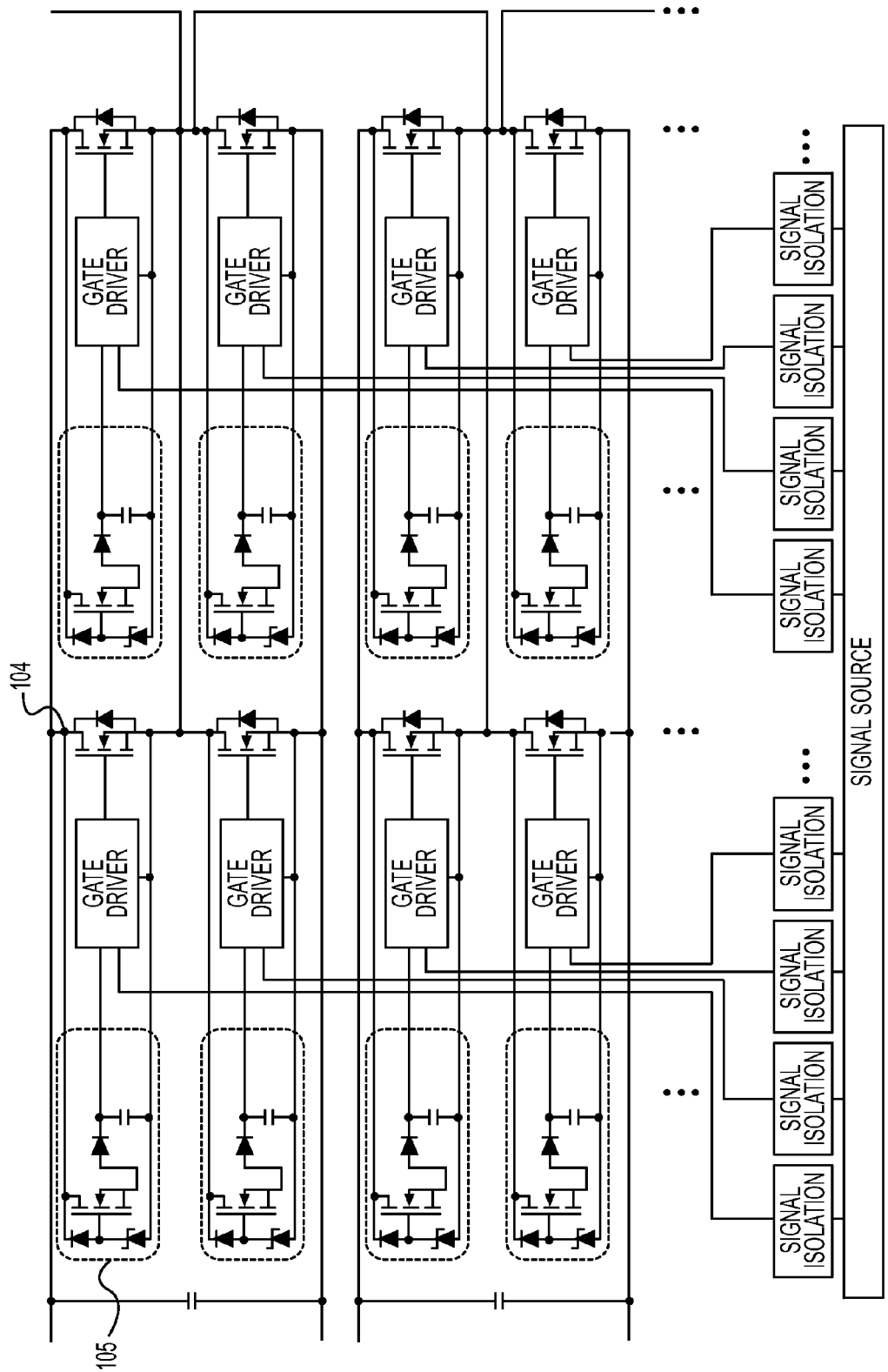
FIG. 36 shows a power conversion apparatus for supplying gate power by connecting a self-feeding circuit to each gate drive unit of a cascade-connected multilevel power conversion circuit.

FIG. 36 shows a cascade-connected multilevel power conversion circuit that includes the interface circuit of FIG. 33 as a self-feeding circuit that includes diodes, a zener diode, a capacitor and a semiconductor switch. The cascade-connected multilevel power converter is a multilevel power conversion circuit realized by a series connection of the output terminals of the single-phase full-bridge circuit of two phases. The high voltage side terminal 104 of the semiconductor switch is connected to the self-feeding circuit 105, and similarly, the high voltage side terminals of each semiconductor switch are connected to the self-feeding circuit. As a result, power can be supplied to all of the gate drivers by utilizing the switching operation of the main circuit without using a common power supply.

(Example 1 of Signal Isolation)

Figure 37:
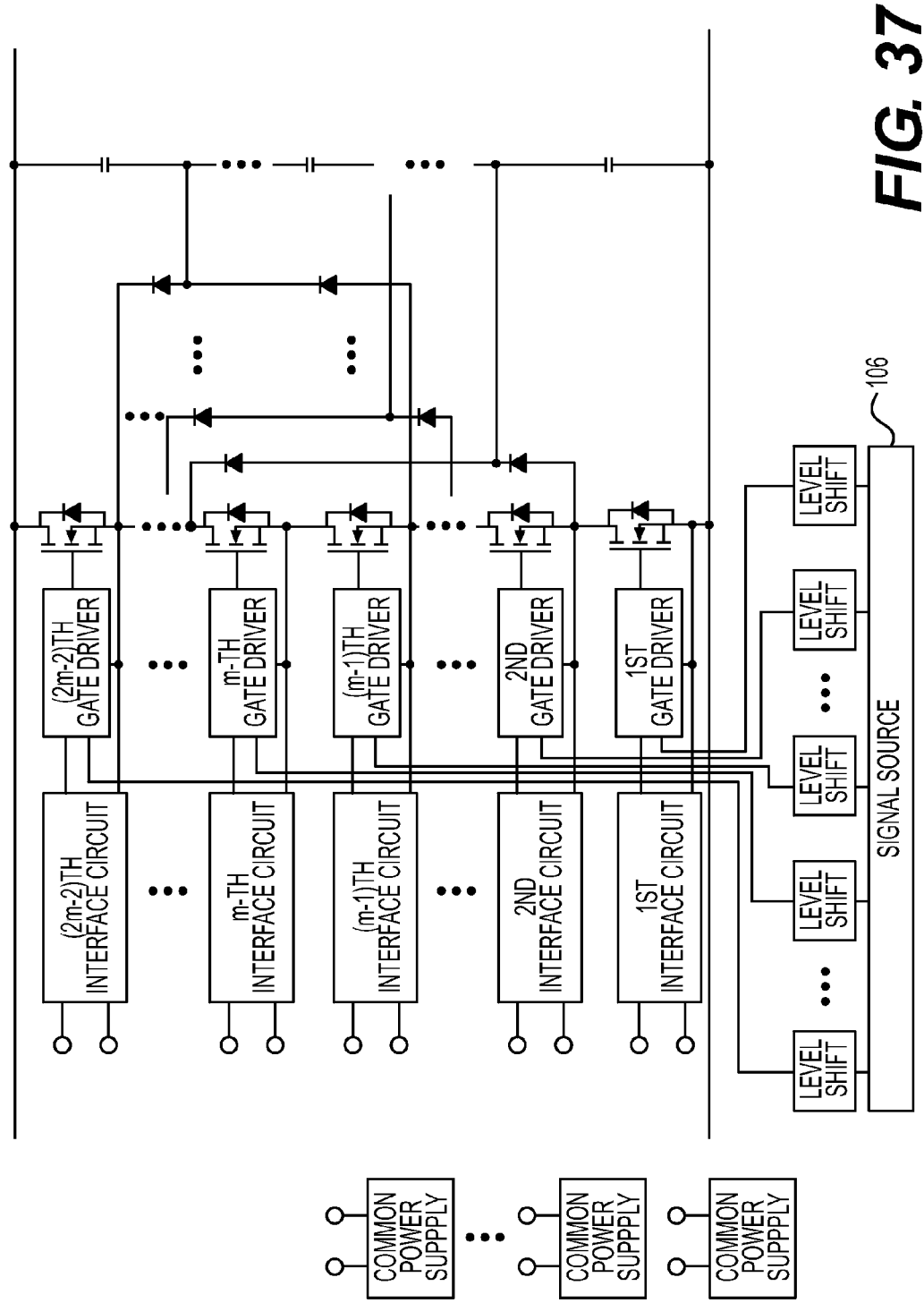
FIG. 37 shows a power conversion apparatus for realizing signal isolation to each gate drive unit of a diode-clamp multilevel power conversion circuit by a level shift circuit.

FIG. 37 shows an example of applying the interface circuit of FIG. 1 to the diode-clamp multilevel power conversion circuit. In the process, as shown in FIG. 37, signals output at the same potential from the signal source 106 are each isolated by a level shift circuit, thereby enabling the switching of each gate driver.

Figure 38:
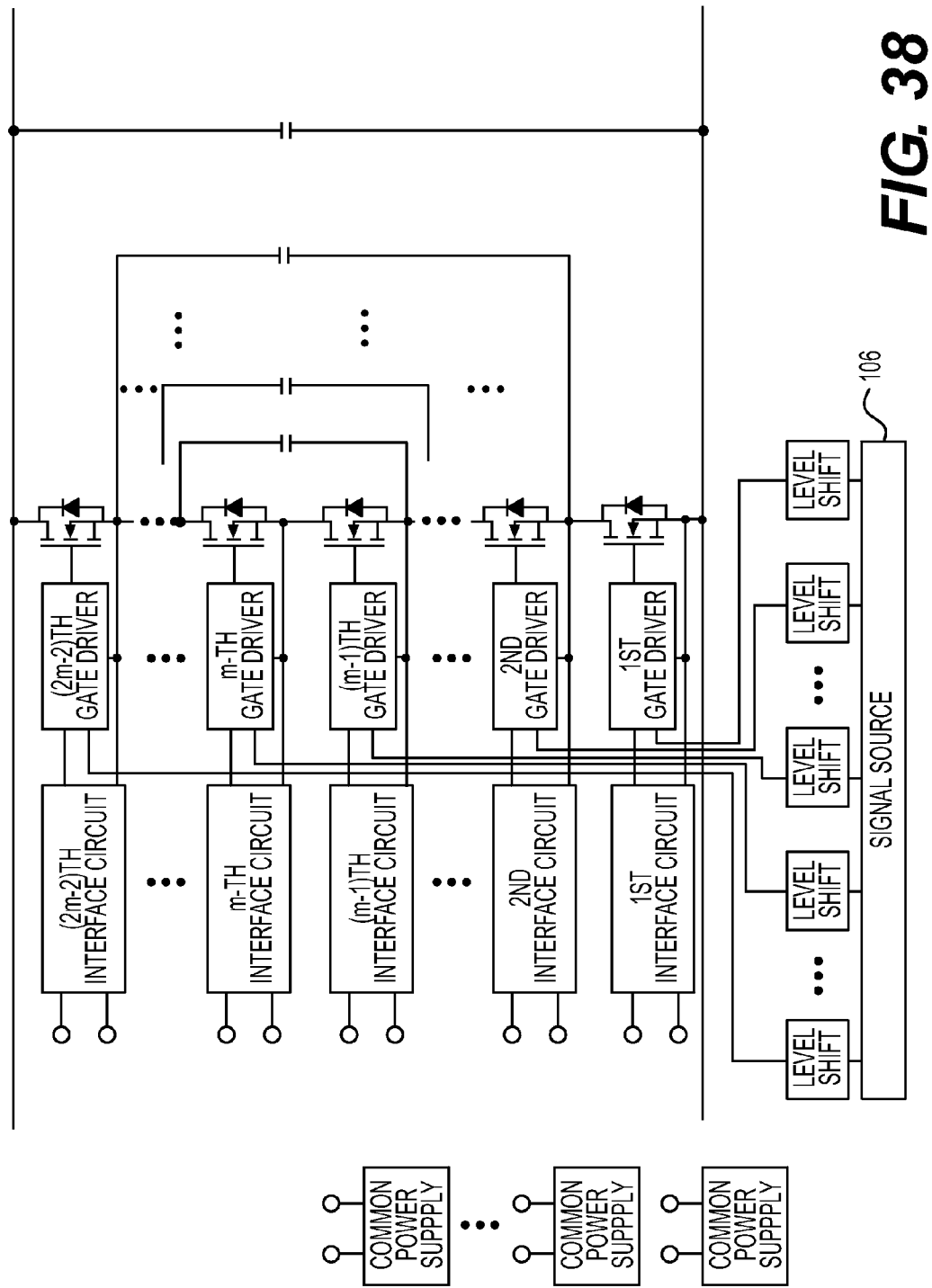
FIG. 38 shows a power conversion apparatus for realizing signal isolation to each gate drive unit of a flying-capacitor multilevel power conversion circuit by a level shift circuit.

FIG. 38 shows an example of applying the interface circuit of FIG. 1 to the flying-capacitor multilevel power conversion circuit. In the process, as shown in FIG. 38, signals output at the same potential from the signal source 106 are each isolated by a level shift circuit, thereby enabling the switching of each gate driver.

Figure 39:
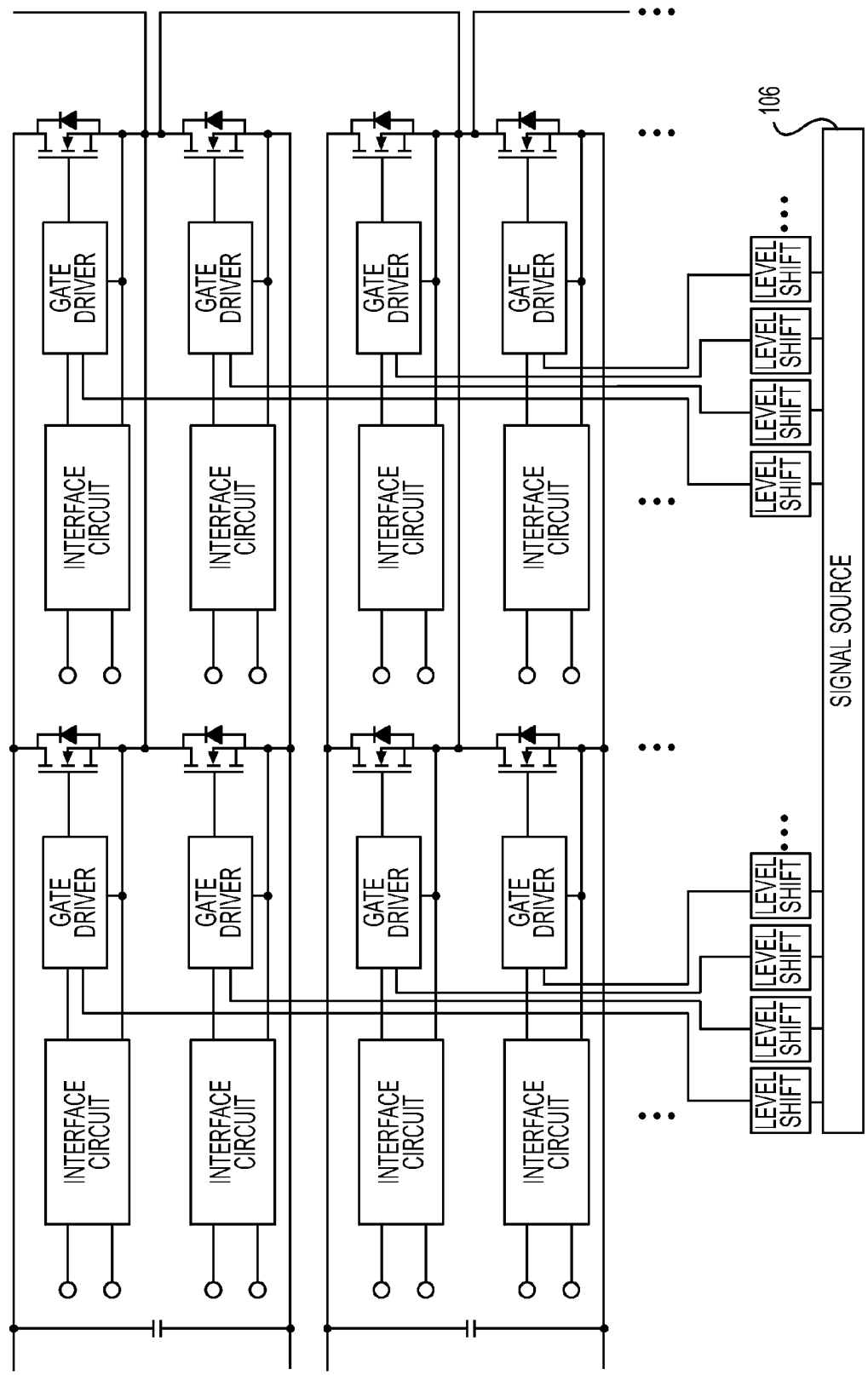
FIG. 39 shows a power conversion apparatus for realizing signal isolation to each gate drive unit of a cascade-connected multilevel power conversion circuit by a level shift circuit.

FIG. 39 shows an example of applying the interface circuit of FIG. 1 to the cascade-connected multilevel power conversion circuit. In the process, as shown in FIG. 39, signals output at the same potential from the signal source 106 are each isolated by a level shift circuit, thereby enabling the switching of each gate driver.

(Example 2 of Signal Isolation)

Figure 40:
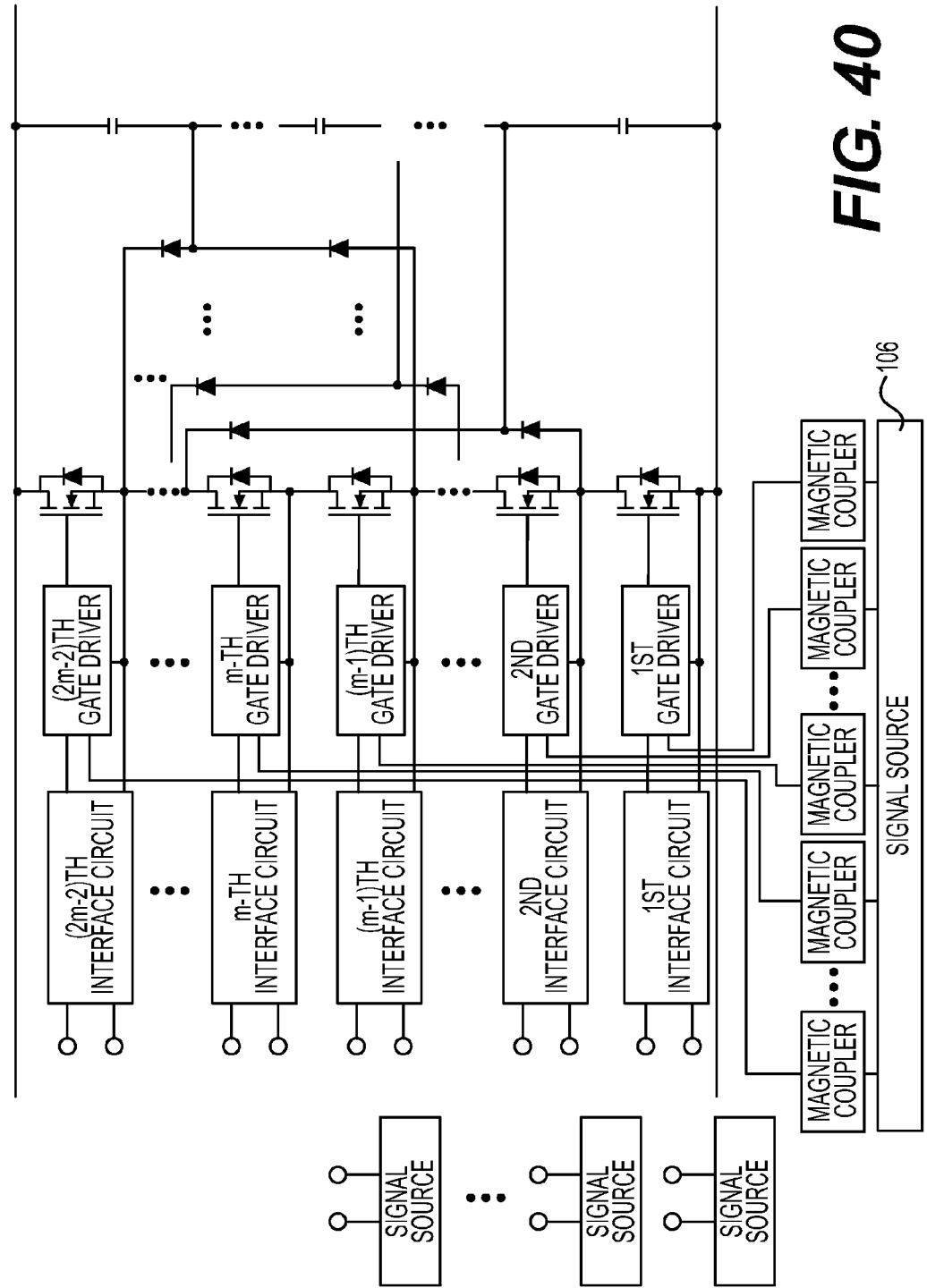
FIG. 40 shows a power conversion apparatus for realizing signal isolation to each gate drive unit of a diode-clamp multilevel power conversion circuit by magnetic coupling.

FIG. 40 shows an example of applying the interface circuit of FIG. 1 to the diode-clamp multilevel power conversion circuit. In the process, as shown in FIG. 40, signals output at the same potential from the signal source 106 are each isolated by magnetic coupling, thereby enabling the switching of each gate driver.

Figure 41:
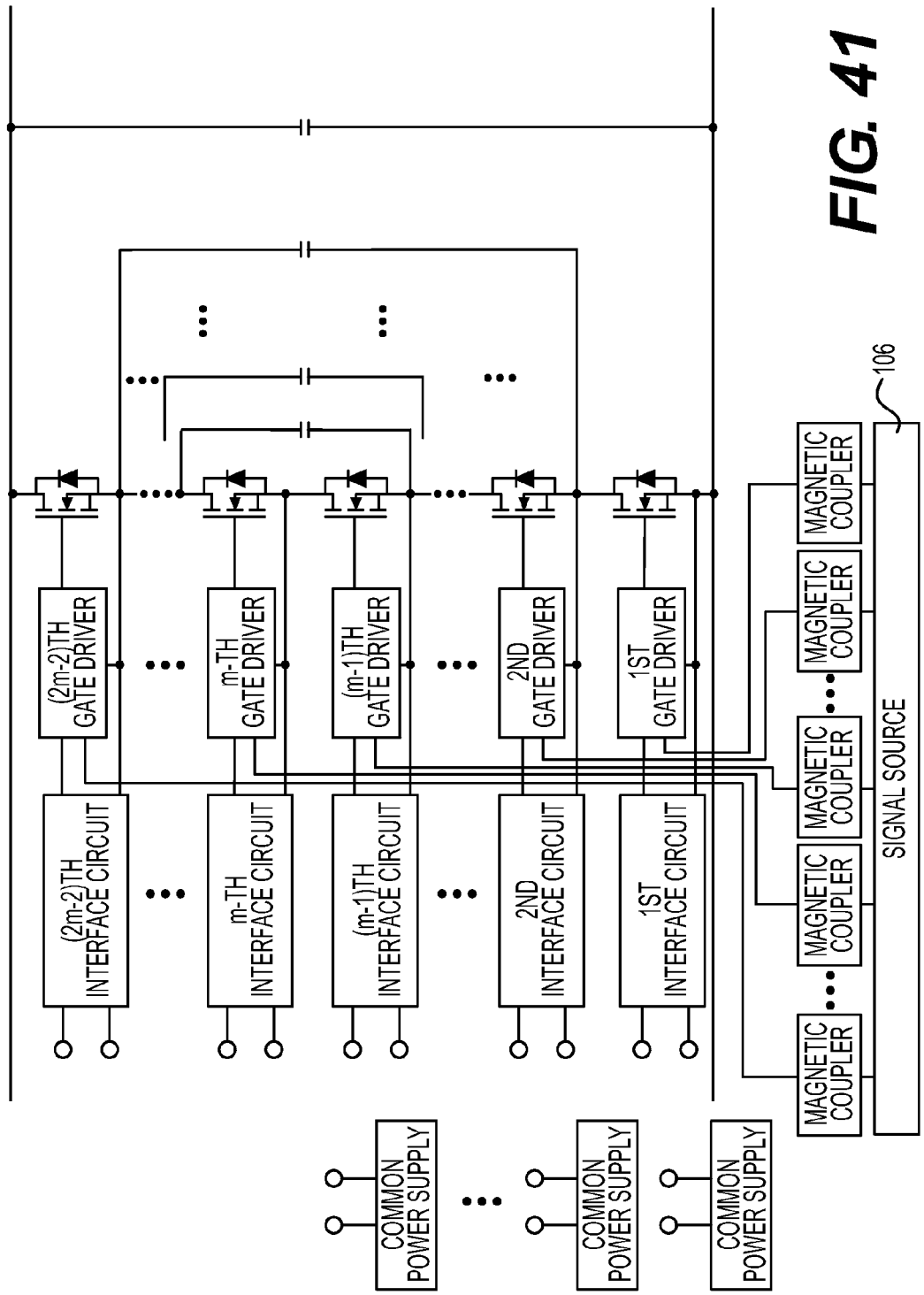
FIG. 41 shows a power conversion apparatus for realizing signal isolation to each gate drive unit of a flying-capacitor multilevel power conversion circuit by magnetic coupling.

FIG. 41 shows an example of applying the interface circuit of FIG. 1 to the flying-capacitor multilevel power conversion circuit. In the process, as shown in FIG. 41, signals output at the same potential from the signal source 106 are each isolated by magnetic coupling, thereby enabling the switching of each gate driver.

Figure 42:
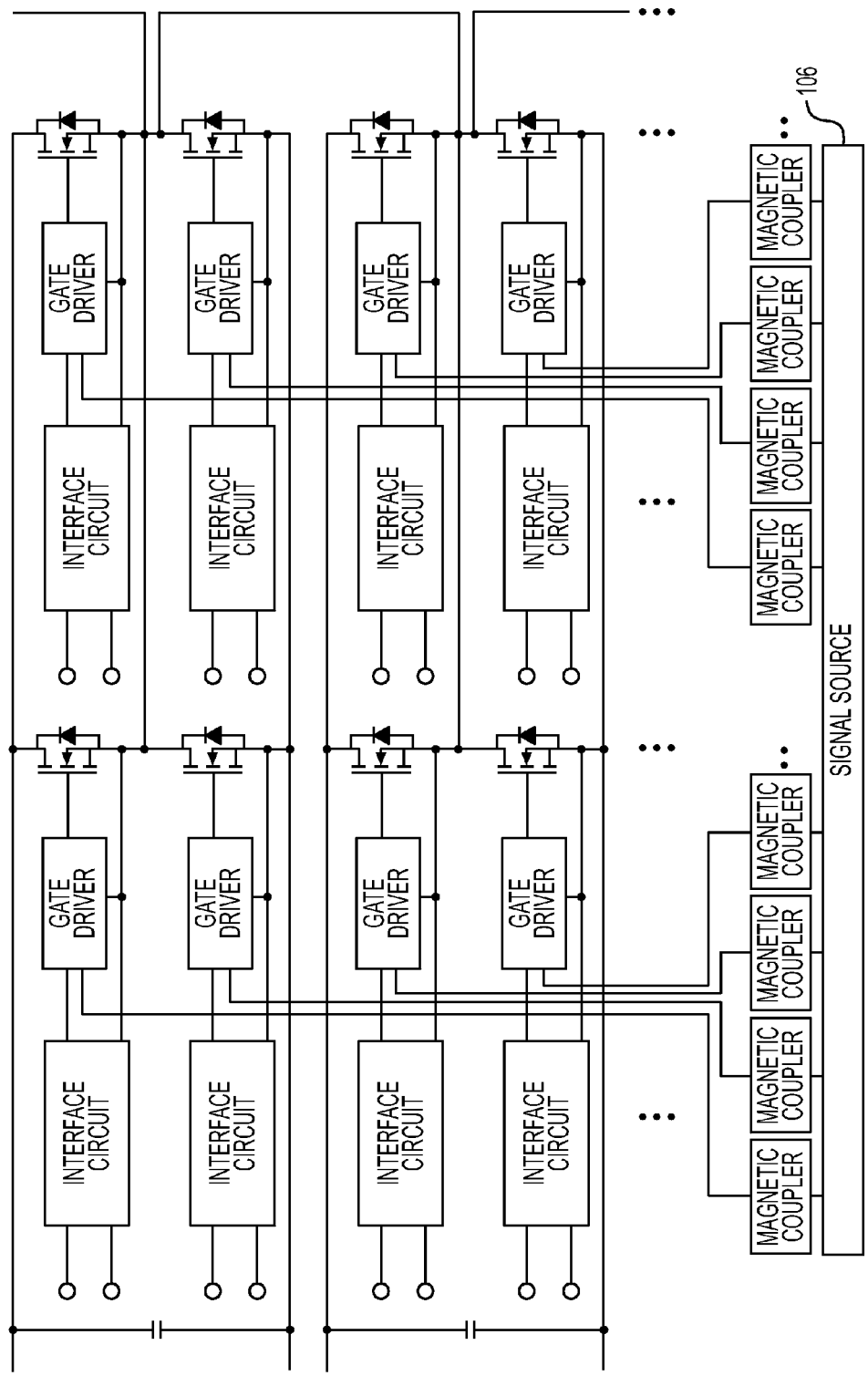
FIG. 42 shows a power conversion apparatus for realizing signal isolation to each gate drive unit of a cascade-connected multilevel power conversion circuit by magnetic coupling.

FIG. 42 shows an example of applying the interface circuit of FIG. 1 to the cascade-connected multilevel power conversion circuit. In the process, as shown in FIG. 42, signals output at the same potential from the signal source 106 are each isolated by magnetic coupling, thereby enabling the switching of each gate driver.

What is claimed is:

1. A power conversion apparatus comprising:
    a plurality of switches including (2m−2) switches constituting a multilevel power converter with m conversion levels;
    an individual gate drive unit that includes (i) a plurality of gate drivers connected to the plurality of switches and (ii) a plurality of interface circuits, the individual gate drive unit requiring no dedicated power supply; and a signal source for transmitting a signal to the individual gate drive unit so that the signal is transmitted in isolation to each of the plurality of gate drivers from the signal source, wherein power is supplied to the individual gate drive unit from a single common power supply, wherein the plurality of interface circuits include (2m−2) interface circuits connected to the (2m−2) switches, respectively, wherein the first to (2m−3)th interface circuits include power supply terminals 1-*a* to (2m−3)-a and 1-*b* to (2m−3)-b, respectively, wherein the (2m−2)th interface circuit includes a power supply terminal (2m−2)-a, wherein the single common power supply includes a high voltage side terminal 1-*a* ' and a ground side terminal 1-*b*', wherein the power supply terminal 1-*b* of the first interface circuit is connected to the ground side terminal 1-*b*' of the single common power supply, wherein the power supply terminal 1-*a* of the first interface circuit and the power supply terminal 2-*b* of the second interface circuit are connected to the high voltage side terminal 1-*a*' of the single common power supply, wherein the power supply terminals 2-*a* to (2m−4)-a of the second to (2m−4)th interface circuits are connected to the power supply terminals 3-*b* to (2m−3)-b of the third to (2m−3)th interface circuits, respectively, wherein the power supply terminal (2m−3)-a of the (2m−3)th interface circuit is connected to the power supply terminal (2m−2)-a of the (2m−2)th interface circuit, and wherein the individual gate drive unit supplies power from the single common power supply to each of the plurality of gate drivers through the plurality of interface circuits.

2. A power conversion apparatus comprising:

a plurality of switches including (2m−2) switches constituting a multilevel power converter with m conversion levels;

an individual gate drive unit that includes (i) a plurality of gate drivers connected to the plurality of switches and (ii) a plurality of interface circuits, the individual gate drive unit requiring no dedicated power supply; and a signal source for transmitting a signal to the individual gate drive unit so that the signal is transmitted in isolation to each of the plurality of gate drivers from the signal source, wherein power is supplied to the individual gate drive unit from a single common power supply, wherein the plurality of interface circuits include (2m−2) interface circuits connected to the (2m−2) switches, respectively, wherein the first to (2m−2)th interface circuits include power supply terminals 1-*a* to (2m−2)-a and 1-*b* to (2m−2)-b, respectively, wherein the single common power supply includes a high voltage side terminal 1-*a*' and a ground side terminal 1-*b*', wherein the power supply terminals 1-*b* to (2m−2)-b of the first to (2m−2)th interface circuits are connected to the ground side terminal 1-*b*' of the single common power supply, wherein the power supply terminals 1-*a* to (2m−2)-a of the first to (2m−2)th interface circuits are connected to the high voltage side terminal 1-*a*' of the single common power supply, and wherein the individual gate drive unit supplies power from the single common power supply to each of the plurality of gate drivers through the plurality of interface circuits.

3. A power conversion apparatus comprising:

a plurality of switches including (2m−2) switches constituting a multilevel power converter with m conversion levels;

an individual gate drive unit that includes (i) a plurality of gate drivers connected to the plurality of switches and (ii) a plurality of interface circuits, the individual gate drive unit requiring no dedicated power supply; and a signal source for transmitting a signal to the individual gate drive unit so that the signal is transmitted in isolation to each of the plurality of gate drivers from the signal source, wherein power is supplied to the individual gate drive unit from a single common power supply, wherein the plurality of interface circuits include (2m−2) interface circuits connected to the (2m−2) switches, respectively, wherein the first interface circuit includes power supply terminals 1-*a* and 1-*b*, wherein the second to (m−1)th interface circuits include power supply terminals 2-*a* to (m−1)-a, respectively;

wherein the m-th interface circuit includes power supply terminals m-a and m-b, wherein the (m+1)th to (2m−2)th interface circuits include power supply terminals (m+1)-a to (2m−2)-a, respectively, wherein the single common power supply includes a high voltage side terminal 1-*a*' and a ground side terminal 1-*b*', wherein the power supply terminal 1-*b* of the first interface circuit is connected to the ground side terminal 1-*b*' of the single common power supply, wherein the power supply terminals 1-*a* to (m−1)-a of the first to (m−1)th interface circuits and the power supply terminal m-b of the m-th interface circuit are connected to the high voltage side terminal 1-*a*' of the single common power supply, wherein the power supply terminal m-a of the m-th interface circuit and the power supply terminals (m+1)-a to (2m−2)-a of the (m+1)th to (2m−2)th interface circuits are connected with each other, and wherein the individual gate drive unit supplies power from the single common power supply to each of the plurality of gate drivers through the plurality of interface circuits.

4. A power conversion apparatus comprising:

a plurality of switches including (2m−2) switches constituting a multilevel power converter with m conversion levels;

an individual gate drive unit that includes (i) a plurality of gate drivers connected to the plurality of switches and (ii)a plurality of interface circuits the individual s ate drive unit requiring no dedicated power supply; and a signal source for transmitting a signal to the individual gate drive unit so that the signal is transmitted in isolation to each of the plurality of gate drivers from the signal source, wherein power is supplied to the individual gate drive unit from a single common power supply, wherein the plurality of interface circuits includes (2m−2) interface circuits connected to the (2m−2) switches, respectively, wherein the first interface circuit includes power supply terminals 1-*a* and 1-*b*, wherein the second to (m−1)th interface circuits include power supply terminals 2-*a* to (m−1)-a; respectively, wherein the m-th interface circuit includes power supply terminals m-a, m-b and m-c, wherein the (m+1)th to (2m−2)th interface circuits include power supply terminals (m+1)-a to (2m−2)-a, respectively, wherein the single common power supply includes a high voltage side terminal 1-a' and a ground side terminal 1-b', wherein the power supply terminal 1-b of the first interface circuit, the ground side terminal 1-b' of the single common power supply and the power supply terminal m-c of the m-th interface circuit are connected with each other, wherein the power supply terminals 1-*a* to (m−1)-a of the first to (m−1)th interface circuits, the power supply terminal m-b of the m-th interface circuit and the high voltage side terminal 1-*a*' of the single common power supply are connected with each other, wherein the power supply terminal m-a of the m-th interface circuit, the power supply terminals (m+1)-a to (2m−2)th of the (m+1)th to (2m−2)th interface circuits are connected with each other, and wherein the individual gate drive unit supplies power from the single common power supply to each of the plurality of gate drivers through the plurality of interface circuits.

5. A power conversion apparatus comprising:

a plurality of switches including (2m−2) switches constituting a multilevel power converter with m conversion levels;

an individual gate drive unit that includes (i) a plurality of gate drivers connected to the plurality of switches and (ii) a plurality of interface circuits, the individual gate drive unit requiring no dedicated power supply; and a signal source for transmitting a signal to the individual gate drive unit so that the signal is transmitted in isolation to each of the plurality of gate drivers from the signal source, wherein power is supplied to the individual gate drive unit from a single common power supply, wherein the plurality of interface circuits includes (2m−2) interface circuits connected to the (2m−2) switches, respectively, wherein the first to (m−1)th interface circuits include power supply terminals 1-*a* to (m−1)-a and 1-*b* to (m−1)-b, respectively, wherein the m-th interface circuit includes a power supply terminal m-a, wherein the (m+1)th to (2m−2)th interface circuits include power supply terminals (m+1)-a to (2m−2)-a, respectively, wherein the single common power supply includes a high voltage side terminal 1-a' and a ground side terminal 1-b', wherein the power supply terminal 1-b of the first interface circuit is connected to the ground side terminal 1-b' of the single common power supply, wherein the power supply terminal 1-*a* of the first interface circuit, the power supply terminals 2-*b* to (m−1)-b of the second to (m−1)th interface circuits and the power supply terminal m-a of the m-th interface circuit are connected to the high voltage side terminal 1-*a*' of the single common power supply, wherein the power supply terminals 2-*a* to (m−1)-a of the second to (m−1)th interface circuits are connected to the power supply terminals (m+1)-a to (2m−2)-a, respectively, and wherein the individual gate drive unit supplies power from the single common power supply to each of the plurality of gate drivers through the plurality of interface circuits.

6. A power conversion apparatus comprising:

a plurality of switches including (2m−2) switches constituting a multilevel power converter with m conversion levels;

an individual gate drive unit that includes (i) a plurality of gate drivers connected to the plurality of switches and (ii) a plurality of interface circuits, the individual gate drive unit requiring no dedicated power supply; and a signal source for transmitting a signal to the individual gate drive unit so that the signal is transmitted in isolation to each of the plurality of gate drivers from the signal source, wherein power is supplied to the individual gate drive unit from a single common power supply, wherein the plurality of interface circuits includes (2m−2) interface circuits connected to the (2m−2) switches, respectively, wherein the first interface circuit includes power supply terminals 1-*a* and 1-*b*, wherein the second to (2m−3)th interface circuits include power supply terminals 2-*a* to (2m−3)-a, 2-*b* to (2m−3)-b and 2-*c* to (2m−3)-c, respectively, wherein the (2m−2)th interface circuit includes power supply terminals (2m−2)-a and (2m−2)-b, wherein the single common power supply includes a high voltage side terminal 1-a' and ground side terminals 1-b' and 1-c', wherein the single power supply terminal 1-b of the first interface circuit is connected to the ground side terminal 1-c' of the single common power supply, wherein the power supply terminal 1-*a* of the first interface circuit, the power supply terminal 2-*c* of the second interface circuit and the high voltage side terminal 1-a' of the single common power supply are connected with each other, wherein the power supply terminals 2-*a* to (2m−4)-a of the second to (2m−4)th interface circuits are connected to the power supply terminals 3-*c* to (2m−3)-c of the third to (2m−3)th interface circuits, respectively, wherein the power supply terminal (2m−3)-a of the (2m−3)th interface circuit, the power supply terminal (2m−2)-b of the (2m−2)th interface circuit and the ground side terminal 1-b' of the single common power supply are connected with each other, wherein the power supply terminals 2-*b* to (2m−3)-b of the second to (2m−3)the interface circuits and the power supply terminal (2m−2)-a of the (2m−2)th interface circuit are connected to the ground side terminal 1-b' of the single common power supply, and wherein the individual gate drive unit supplies power from the single common power supply to each of the plurality of gate drivers through the plurality of interface circuits.

7. A power conversion apparatus comprising:

a plurality of switches including (2m−2) switches constituting a multilevel power converter with m conversion levels;

an individual gate drive unit that includes (i) a plurality of gate drivers connected to the plurality of switches and (ii) a plurality of interface circuits the individual ate drive unit requiring no dedicated power supply; and a signal source for transmitting a signal to the individual gate drive unit so that the signal is transmitted in isolation to each of the plurality of gate drivers from the signal source, wherein power is supplied to the individual gate drive unit from a plurality of common power supplies fewer in number than the number of the plurality of switches, wherein the plurality of interface circuits includes (2m−2) interface circuits connected to the (2m−2) switches, respectively, wherein the first interface circuit includes power supply terminals 1-*a* and 1-*b*;

wherein the second to (m−1)th interface circuits includes power supply terminals 2-*a* to (m−1)-a, respectively, wherein the m-th interface circuit includes power supply terminals m-a and m-b;

wherein the (m+1)th to (2m−2)th interface circuits include power supply terminals (m+1)-a to (2m−2)-a, respectively, wherein the plurality of common power supplies include a first common power supply and a second common power supply, wherein the first common power supply and the second common power supply include high voltage side terminals 1-*a'* and 2-*a'* and ground side terminals 1-*b'* and 2-*b'*,respectively;

wherein the power supply terminal 1-*b* of the first interface circuit is connected to the ground side terminal 1-*b'* of the first common power supply, wherein the power supply terminals 1-*a* to (m−1)-a of the first to (m−1)th interface circuits are connected to the high voltage side terminal 1-*a' of the first common power supply*, wherein the power supply terminal m-b of the m-th interface circuit is connected to the ground side terminal 2-*b'* of the second common power supply, wherein the power supply terminals m-a to (2m−2)-a of the m-th to (2m−2)th interface circuits are connected to the high voltage side terminal 2-*a'* of the second common power supply, and wherein the individual gate drive unit supplies power from the first common power supply and the second common power supply to each of the plurality of gate drivers through the plurality of interface circuits.

8. A power conversion apparatus comprising:

a plurality of switches including (2m−2) switches constituting a multilevel power converter with m conversion levels;

an individual gate drive unit that includes (i) a plurality of gate drivers connected to the plurality of switches and (ii) a plurality of interface circuits, the individual gate drive unit requiring no dedicated power supply; and a signal source for transmitting a signal to the individual gate drive unit so that the signal is transmitted in isolation to each of the plurality of gate drivers from the signal source, wherein power is supplied to the individual gate drive unit from a main circuit including a plurality of power supply terminals connected to the plurality of interface circuits, wherein the plurality of interface circuits includes (2m−2) interface circuits connected to the (2m−2) switches, respectively, wherein the first to (2m−2) th interface circuits include power supply terminals 1-*a* to (2m−2)-a, respectively, wherein high potential sides of the first to (2m−2)th switches are connected to the power supply terminals 1-*a* to (2m−2)-a of the first to (2m−2)th interface circuits, and wherein the individual gate drive unit supplies power to each of the plurality of gate drivers through the plurality of interface circuits from the main circuit without using a common power supply.

\* \* \* \* \*